(12) United States Patent
Ina et al.

(10) Patent No.: US 6,552,798 B2
(45) Date of Patent: Apr. 22, 2003

(54) POSITION DETECTING METHOD AND SYSTEM FOR USE IN EXPOSURE APPARATUS

(75) Inventors: Hideki Ina, Yokohama (JP); Takehiko Suzuki, Satsute (JP); Atsushi Kitaoka, Kisarazu (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/873,304

(22) Filed: Jun. 5, 2001

(65) Prior Publication Data

US 2002/0015156 A1 Feb. 7, 2002

(30) Foreign Application Priority Data

Jun. 5, 2000 (JP) ........................................ 2000-168136

(51) Int. Cl.$^7$ ................................................. G01B 9/02
(52) U.S. Cl. ........................ 356/493; 356/492; 356/508; 356/509
(58) Field of Search ................................ 356/508, 509, 356/492, 493

(56) References Cited

U.S. PATENT DOCUMENTS

| 5,097,261 | A | * | 3/1992 | Langdon et al. | ............... 341/51 |
| 5,477,057 | A | * | 12/1995 | Angeley et al. | ............ 250/548 |
| 6,091,496 | A | * | 7/2000 | Hill | ............................. 356/450 |
| 6,271,909 | B1 | * | 8/2001 | Suzuki et al. | ................. 355/53 |

* cited by examiner

Primary Examiner—Constantine Hannaher
(74) Attorney, Agent, or Firm—Fitzpatrick, Cella, Harper & Scinto

(57) ABSTRACT

A position detecting method and position detecting system, for measuring a position of a pattern formed on an object to be observed, for use in an exposure apparatus. The method includes providing incoherence-transformed illumination light for illuminating the pattern surface of the object by use of coherent light, and incoherence-transformed reference light, changing the quantity of the reference light in accordance with a reflection factor of the pattern surface, imaging reflection light from the pattern surface and reference light reflected by a conjugate mirror, together, upon a photoelectric converting element, and measuring the position of the pattern on the basis of an interference image signal obtainable by the imaging.

51 Claims, 16 Drawing Sheets

FIGURE 4 SIGNAL

FIGURE 5 SIGNAL

DIFFERENTIAL SIGNAL

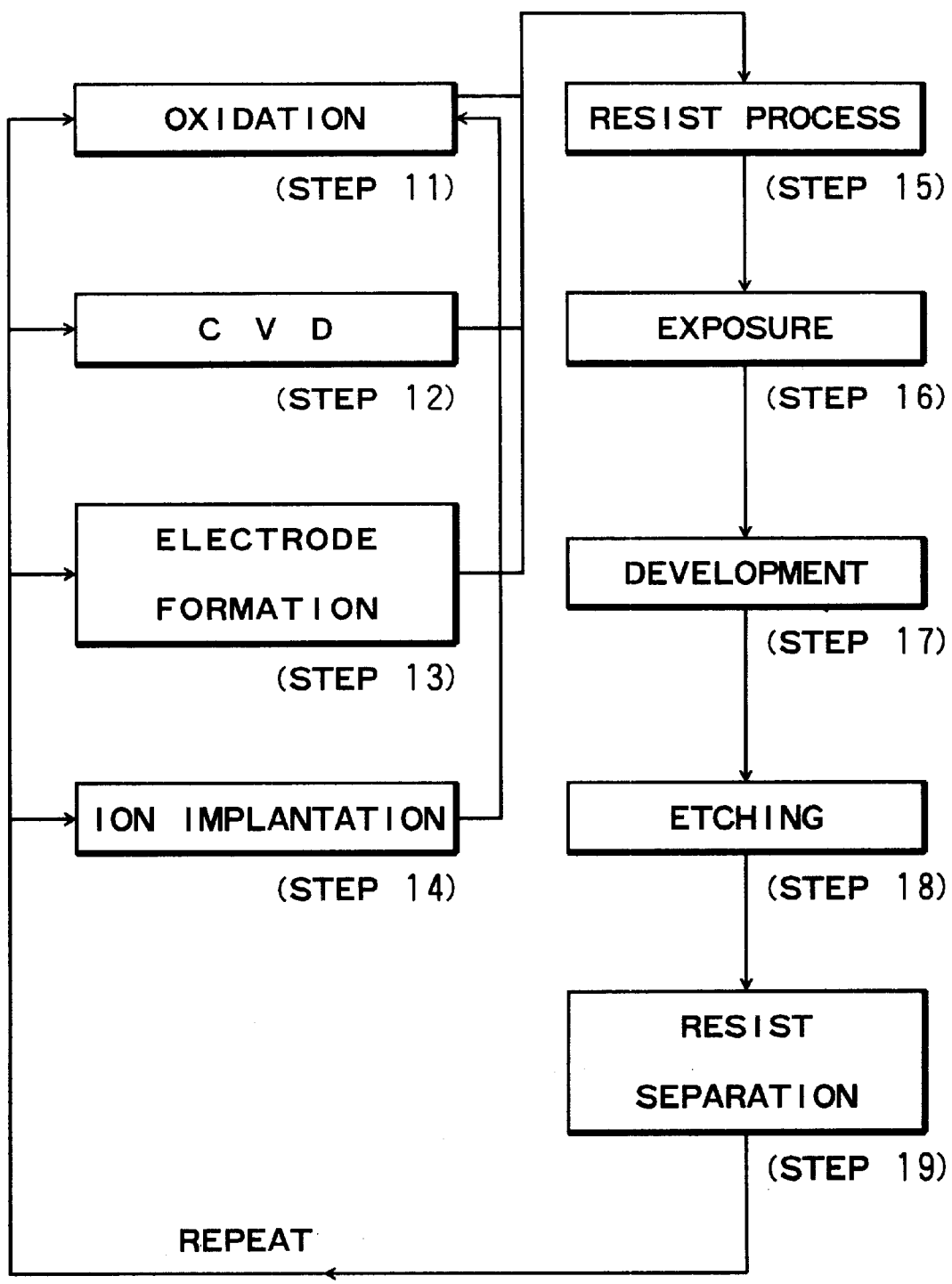
F I G. 18

POSITION DETECTING METHOD AND SYSTEM FOR USE IN EXPOSURE APPARATUS

FIELD OF THE INVENTION AND RELATED ART

This invention relates to a position detecting method and a position detecting system. Also, the invention concerns an exposure apparatus, a device manufacturing method, a semiconductor manufacturing factory, and/or a maintenance method for an exposure apparatus, using such a position detecting system. In another aspect, the invention is directed to an interference microscope for measuring the position of a pattern on an object, to be observed through an imaging optical system, and for detecting the position of that object on the basis of it.

For example, the invention is applicable to an alignment detecting system in an exposure apparatus for semiconductor manufacture, or an overlay inspecting system to be used for inspection of distortion or any performance such as alignment precision, in an exposure apparatus.

Projection exposure apparatuses for semiconductor manufacture are required to have a performance of projecting and printing a circuit pattern formed on the surface of a reticle onto the surface of a wafer with a high resolving power, to meet the increasing density of integrated circuits. The projection resolving power for a circuit pattern can be improved, for example, by enlarging the numerical aperture (NA) of a projection optical system while keeping the wavelength of exposure light unchanged. Alternatively, it can be done by shortening the wavelength of exposure light, such as changing light from g-line to i-line, from i-line to excimer laser emission wavelength, or to $F_2$ laser emission wavelength or SOR light.

On the other hand, there are requirements for higher precision alignment of a reticle (having an electronic circuit pattern) and a wafer, to meet further miniaturization of circuit patterns. The required precision is generally one-third or less of the circuit pattern. For a 1 gigabit DRAM with a 0.18 micron rule circuit pattern, for example, an overlay precision of 60 nm or less (alignment over the whole exposure region) is required. Further, as for an overlay inspection system for measuring this overlay precision, a precision of one-tenth of the overlay precision is required. Thus, a precision of 6 nm or less is necessary, for a 1 gigabit DRAM.

There is a TIS correction method for reducing the influence of a TIS (Tool Induced Shift), which is a detection system factor among measurement error producing factors, to attain high precision measurement.

Referring to FIG. 1, the TIS correction method will be explained. In FIG. 1, as an example, a surface step (level difference) is produced on a silicon wafer by an etching process, and, after alignment with that pattern, the relative relationship with respect to a resist image pattern defined by exposure and development is measured. In the TIS correction method, the measurement is carried out twice. The second measurement is made with the wafer being rotated 180 degrees, as compared with the first measurement. Thus, the result in the first measurement is called a "0-deg. measured value", and the result in the second measurement is called a "180-deg. measured value". In the TIS correction method, a value ($\Delta$TIS correction) which is obtainable by subtracting the 180-deg. measured value from the 0-deg. measured value and then by bisecting the remainder, is taken as a measured value. With this procedure, the error due to the detection system factor is reduced to attain high precision measurement. Here, the value obtained by adding the 0-deg. measured value and the 180-deg. measured value and then by bisecting the sum, is called a "TIS".

Most of the overlay inspection systems or alignment detection systems, currently available, use a bright-field image processing method. FIG. 2 shows a known example of an overlay inspection system.

In the inspection system of FIG. 2, exclusive marks 2 and 3 are formed on a wafer 1. Images of these marks are formed through an optical system upon an image pickup device 14 such as a CCD, and the position is detected by processing an electric signal from the CCD.

The imaging performance most required in this optical system is the symmetry of image. If there is something in the optical system that deteriorates the image symmetry, a TIS is produced.

These types of detecting systems use a high optical magnification such as 100x, for example, and in most cases, a region close to the optical axis is used. Therefore, the major factor causing degradation of the image symmetry is not abaxial aberrations but non-uniformness of the illumination system and eccentric coma aberration close to the optical axis of the optical system.

In recent semiconductor processes, flattening has been advanced, and a CMP (Chemical Mechanical Polishing) process is carried out at plural steps.

However, the flattening technology raises a critical problem to alignment or overlay inspection machines. As a result of the flattening process, the level difference (surface step) of a mark to be used for the detection is eliminated. In the bright-field image processing method which is used most prevalently and with a good precision, the contrast of a mark image to be used for the measurement becomes very poor, which directly leads to deterioration of the detection precision.

As a measure for such a problem, a phase difference detecting method has been proposed. However, this method needs a phase plate in a portion of the optical system, and this is a factor for producing a TIS as described above. Therefore, while the contrast may be better, a good precision may not be attainable. Particularly, since the phase plate should be made mountable/demountable into and out of the optical system so as to allow coexistence with an ordinary bright-field system, this creates a factor for a large TIS.

An interferometer detecting method may be a detecting method not sensitive to a TIS. An example will now be described, in conjunction with FIG. 3.

First, a conventional overlay inspecting system of FIG. 2 will be described, and second, the interferometer detecting system shown in FIG. 3 will be described.

In FIG. 2, an etching pattern mark 2 is produced on a silicon etching wafer 1, through a lithographic process, a development process and an etching process. Then, upon the etching pattern mark 2, a resist pattern mark 3 is formed through a lithographic process and a development process. In an overlay inspecting system, the relative positional relation between these two marks 2 and 3 is just going to be measured. To this end, the marks 2 and 3 are illuminated with light 6 emitted from a halogen lamp 5. More specifically, the light 6 from the lamp goes through a fiber 7 and an illumination system 8, and S-polarized light is reflected by a polarization beam splitter 9. Thereafter, the light passes through a relay 12 and via a mirror 4, and then through a quarter waveplate 10 and an objective lens 11, to illuminate the marks 2 and 3.

Reflected light from the marks 2 and 3 passes backwardly through the objective lens 11, the quarter waveplate 10 and the relay 12. Since the polarization direction is P-polarization, the light is transmitted through the polarization beam splitter 9. Then, by means of an erector 13, an image is formed on the image pickup surface of a CCD camera 14. The observation image thus formed on the image pickup surface is photoelectrically converted by the CCD camera 14, and a corresponding signal is applied to a computer (calculating means) 15 through a line. The computer 15 performs image processing to the received signal, and it detects the relative positional relationship between the two marks.

Here, the polarization beam splitter 9 and the quarter waveplate 10 are used for the sake of efficient use of the light quantity. If the light source has a large power or the object to be observed has a large reflection factor such that the loss of light quantity can be disregarded, use of a polarization beam splitter or a quarter waveplate may be omitted. A half mirror may be used, for example, in place of it.

The wafer 1 is placed on a wafer chuck (not shown). The wafer chuck is mounted on a θ-Z stage (driving means, not shown), and it functions to attract the wafer 1 toward the chuck surface, so as to prevent shift of the wafer 1 position against various vibrations. The θ-Z stage is mounted on a tilt stage (not shown), and it functions to move the wafer 1 upwardly and downwardly, along a focus direction (optical axis direction of the optical system).

Now, an example of an interferometer detecting method will be described, with reference to FIG. 3.

The inspecting system of FIG. 3 uses a light source which may be a He—Ne laser 31, for example. Except that the light source is different, the structure for forming an image of the wafer 1 upon the image pickup surface of a CCD camera 14 is essentially the same as that of the FIG. 2 example. However, in this example, a quarter waveplate 21 is inserted between the polarization beam splitter 9 and the erector 13, for strengthening the coherence with reference light effective to provide an observation image as an interference image.

Further, since the light source is coherent light using the He—Ne laser 31, if it is used directly for the illumination, a speckle will be produced on the wafer 1. In order to avoid this, the light has to be made incoherent. This can be done in various ways. In the example of FIG. 3, a rotary diffusion plate is disposed between the light source (He—Ne laser) 31 and the fiber 7, to move and thus to average the speckle within a time period in which it is taken in by the CCD camera 14 as an image.

The reference light for providing an observation image as an interference image, will be explained.

The light 6 emitted from the laser 31 passes through the fiber 7 and the illumination system 8, and P-polarized light is transmitted through the polarization beam splitter 9. The P-polarized light is then transformed into circularly polarized light by the quarter waveplate 22, and it is reflected by a mirror 23.

Here, the mirror 23 is disposed at a plane optically conjugate with the wafer 1 to be observed. The reflected light again passes through the quarter waveplate 22, and it is transformed into S-polarized light. It is now reflected by the polarization beam splitter 9, and, after passing through the quarter waveplate 21, it is projected by the erector 13 on the image pickup surface of the CCD camera 14, as reference light.

By the reflection light from the wafer 1 and the reference light, described above, an interference image is produced.

An interference image can be produced in this manner, and this image has better contrast as compared with an image formed by conventional bright-field illumination.

As the focus of the wafer 1 changes, the interference condition also changes. It causes changes in the bright and dark portions of the interference fringe. FIG. 5 shows a case where an outside region 42 of an alignment mark is dark, under the interference condition. FIG. 4 shows a case where, as compared with FIG. 5, an outside region 42 of an alignment mark is bright, under the interference condition.

In consideration of this, by taking a difference between the interference images at two different focuses, an image with double contrast can be produced.

The above-described two focuses are those for which the difference in the output of the CCD camera 14 between the outside regions 42 of the alignment marks 41 in FIGS. 4 and 5 (i.e., the difference in image intensity between them) becomes largest and those having opposite signs.

For example, it is assumed that the level difference (step difference) of the alignment mark 41 is equal to one-fourth (¼) of the illumination wavelength λ (633 nm in the case of a He—Ne laser). In this case, if the focus is changed to a bright condition of interference where the optical path difference between the outside region 42 of the mark and the reference light becomes equal to a multiple, by an integer, of the illumination wavelength λ, then, as shown in FIG. 4, the interference image in the outside region 42 of the mark has a strongest intensity. On the other hand, as regards the alignment mark 41, since the surface step difference is ¼, the intensity becomes lowest. Here, if the reflection intensity of the reference light and the reflection intensity from the wafer are equal to each other, the visibility (sharpness) of the interference fringe becomes higher, and therefore the intensity is completely eliminated.

Next, if the focus is changed by ¼ from the preceding focus, then, as shown in FIG. 5, a dark condition of interference results where the optical path difference between the reference light and the outside region 42 of the mark corresponds to a multiple, by an integer, of the illumination wavelength λ plus ¼. Thus, the interference image in the outside 42 of the mark has a lowest intensity. As regards the alignment mark 41, on the other hand, since the level difference is ¼, the intensity becomes highest.

FIG. 6 shows signals in these cases, obtained by photoelectric conversion. In the FIG. 5 signal, the alignment mark portion 41 is high, whereas it is low in the FIG. 4 signal.

Thus, by taking the difference between these two signals, a signal having a contrast two times higher than an interference image signal based on a single focus, is obtainable.

When the system to be used in conventional bright-field illumination which does not need reference light, a light blocking plate (shutter 24) shown in FIG. 3 may be inserted. This is similar to the structure of FIG. 2.

With this procedure, even for a CMP wafer having a small surface level difference, a high-contrast signal can be detected.

However, it has been found that the reflection factor of a wafer changes largely in dependence upon the process, and that the contrast of an alignment signal (interference signal) changes with the change in reflection factor.

This is a change in contrast of a fringe, which is called the visibility of interference fringe as described hereinbefore. When the reflection light from an object to be measured and the reference light have the same amplitude upon the interference observation surface and upon the CCD camera surface, in an image processing system, the interference fringe has a highest visibility. As the difference in amplitude becomes larger, the visibility of the interference fringe becomes lower. Thus, in various wafer processes, an optical image of stable and high contrast and a signal of high contrast are not obtainable.

SUMMARY OF THE INVENTION

It is an object of the present invention to provide a position detaching method and a position detecting system, by which, in regard to a subject of observation in various processes such as semiconductor processes, an optical image signal of high contrast can be obtained stably regardless of a change in reflection factor, and, particularly, by which stable and high precision position detection is enabled even in a process for a low surface level difference such as CMP.

It is another object of the present invention to provide a semiconductor manufacturing exposure apparatus in which the position detecting system such as described above is used as an alignment detecting system for the exposure apparatus or as an overlay inspecting system for inspection of the performance such as distortion or alignment precision, for example.

It is a further object of the present invention to provide a device manufacturing method or a semiconductor manufacturing factory, using such an exposure apparatus, or a maintenance method for such an exposure apparatus.

It is yet a further object of the present invention to accomplish high precision position detection by use of an inexpensive and compact system in which factors for deterioration of the footprint of an optical system member or factors for enlargement in size of the optical system member are excluded.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 18 is a flow chart for explaining details of a wafer process.

DESCRIPTION OF THE PREFERRED EMBODIMENTS

The principle of a position detecting system will be described with reference to first to third embodiments of the present invention, and in conjunction with FIGS. 7–9.
Embodiment 1

Figure 7:
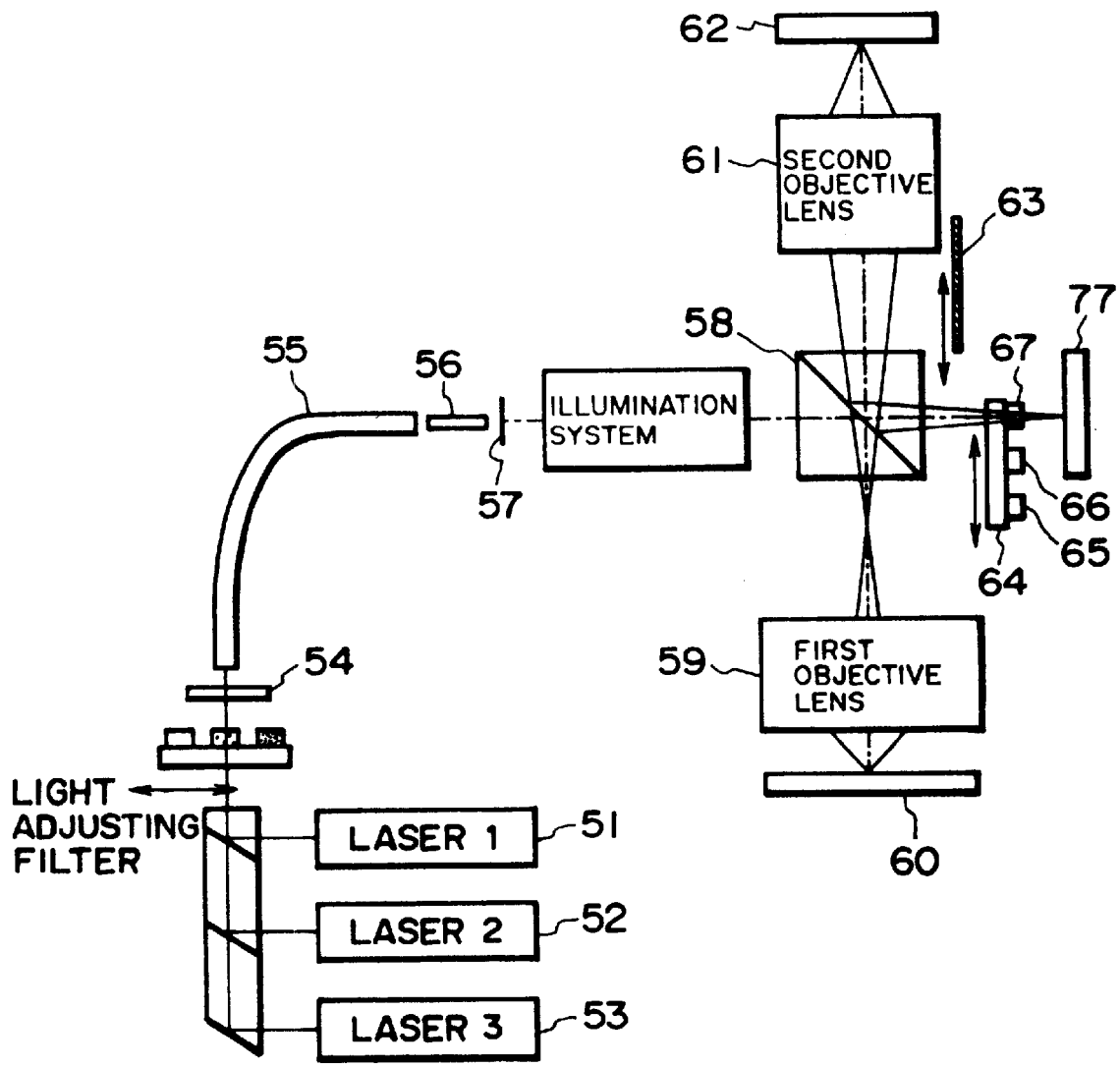
FIG. 7 is a schematic view of an embodiment of a first structure according to the present invention, and it shows an example of a detecting system which uses a plurality of attenuating filters for adjustment of reference light.

FIG. 7 shows a first embodiment for explaining the principle of a position detecting system of the present invention. FIG. 7 concerns an example in which there is a margin with respect to the light quantity. As regards a prism, a beam splitter 58 having no polarizing characteristics is used.

As regards the light source, this embodiment uses a He—Cd laser 51 (wavelength 441.6 nm), an Ar laser 52 (wavelength 514.6 nm) and a He—Ne laser 53 (632.8 nm), selectively. Light emitted from any one of these laser light sources 51, 52 and 53, being arranged for selective use, passes through a rotary diffusion plate 54 being rotated for the incoherence transformation, by which the light is diffused. The light then enters a fiber 55. With the provision of the rotary diffusion plate 54 on the light path, coherent light can be transformed into incoherent light. When the rotary diffusion plate 54 is disposed between the light source and the fiber 55, for directing the light from the light source to an optical system including a beam splitter 58, any unwanted degradation of the precision, for example, in the optical system components can be prevented. The light enters the fiber 55 and exits therefrom. After this, the light enters an optical rod 56 as an illumination uniforming element and a computer hologram 57 having a function as a high efficiency diffusion plate. A portion of the light is reflected by the beam splitter 58. As described above, this beam splitter 58 does not need a polarization beam splitter. When polarization is not utilized, a half prism having a transmission factor and a reflection factor both being 50%, is effective to provide an efficient system.

A portion of light reflected by the beam splitter 58 enters a finite-corrected first objective lens 59, and it illuminates an object 60 to be observed, such as a wafer, for example.

Figure 1:
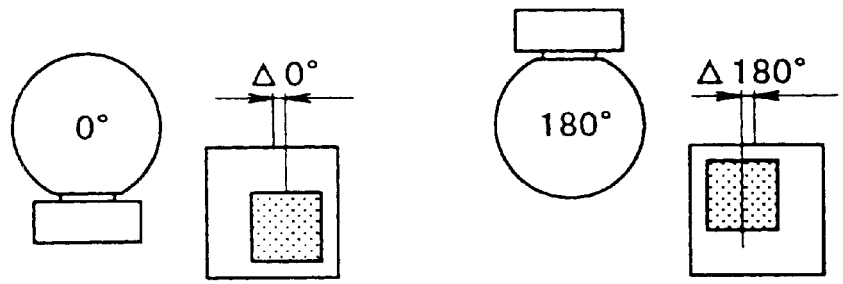
FIG. 1 is a schematic view for explaining the principle of TIS correction.
Figure 2:
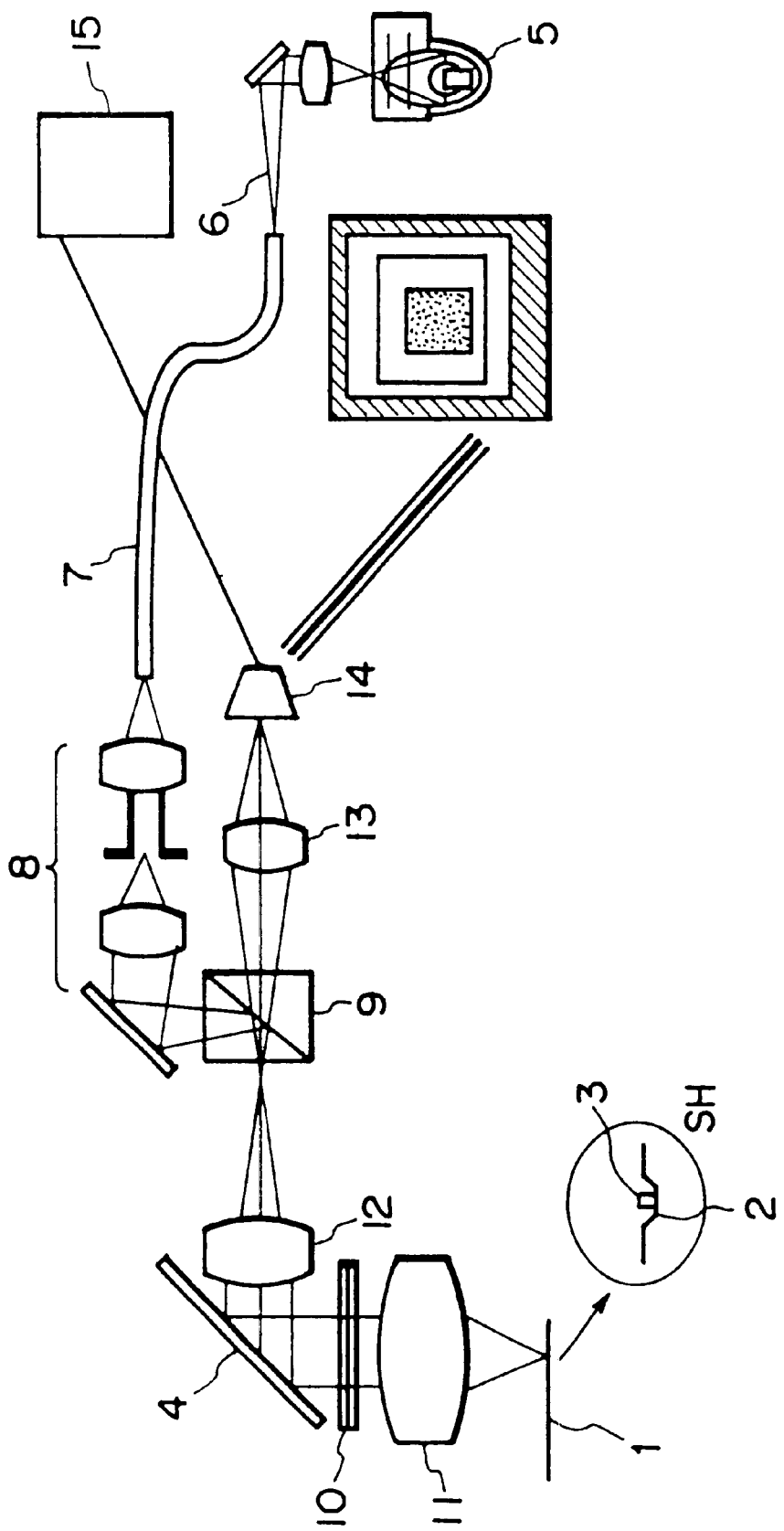
FIG. 2 is a schematic view of an example of an optical structure of a conventional overlay inspecting system.
Figure 3:
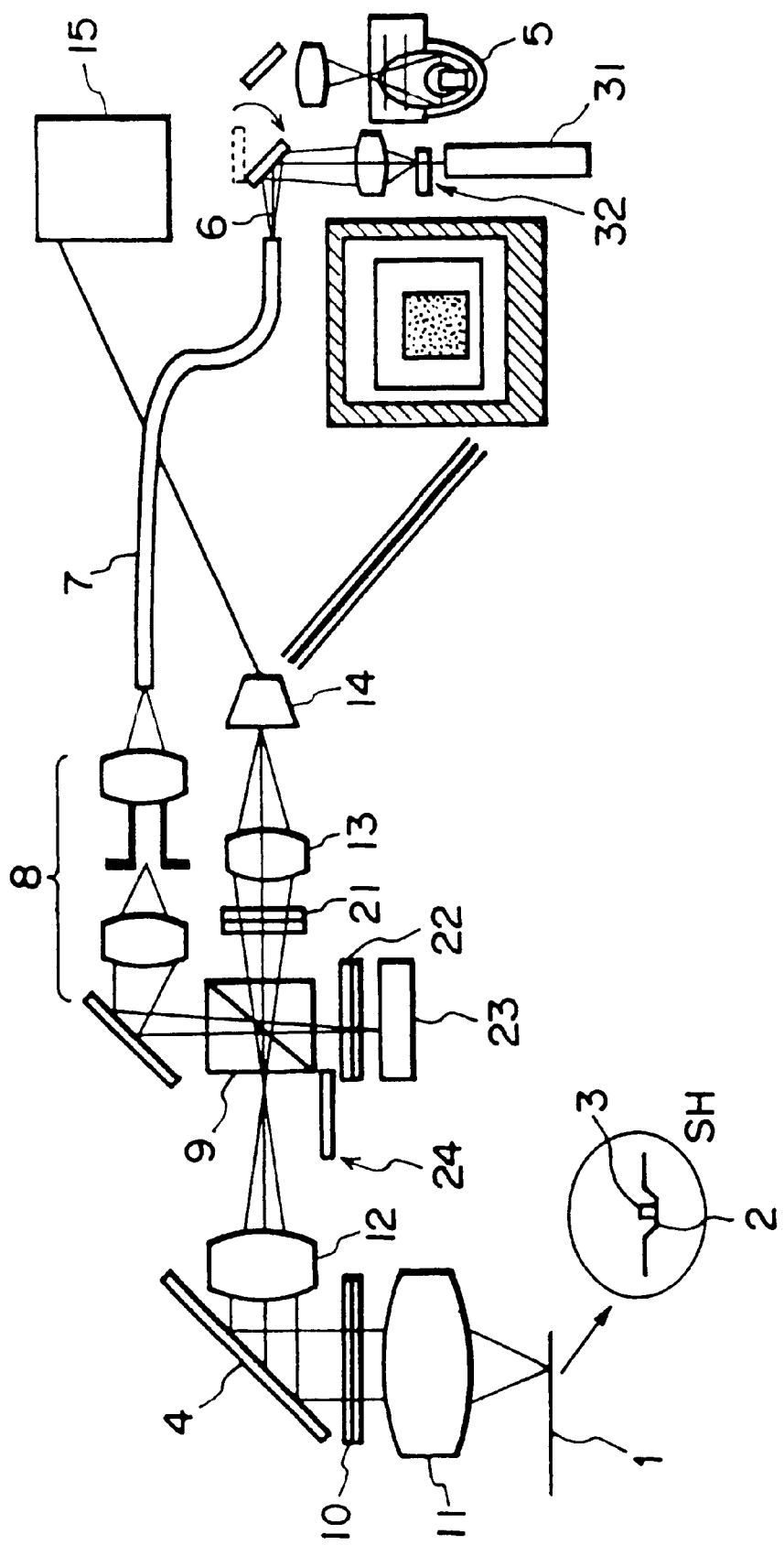
FIG. 3 is a schematic view of an example of an optical structure of an overlay inspecting system in which the contrast of an optical image is improved by an interference method.
Figure 4:
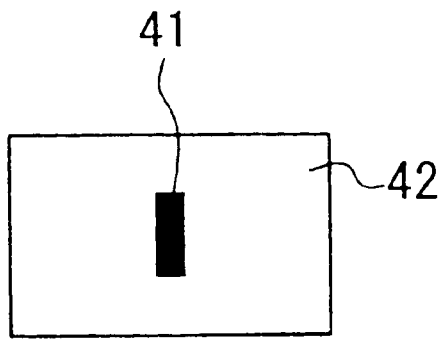
FIG. 4 is a schematic view of an interference image, at a focus under the condition that the outside region of a mark is bright.
Figure 5:
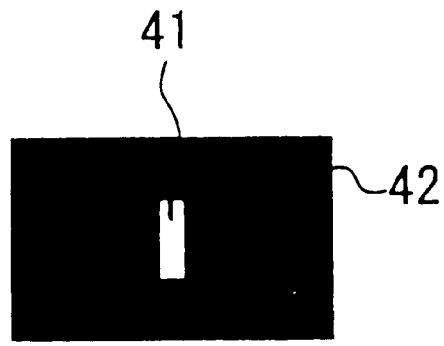
FIG. 5 is a schematic view of an interference image, at a focus under the condition that the outside region of a mark is dark.
Figure 6:
FIG. 6 is a schematic view for explaining, in relation to the interference image detection, a signal in a case where the mark outside is bright, a signal in a case where the mark outside is dark, and a signal corresponding to the difference between these two signals.
Figure 6:
Figure 6:
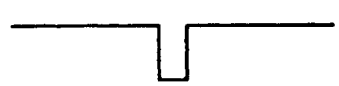

Light reflected by the object 60 again enters the first objective lens 59 and, now, it is transmitted by the beam splitter 58. Then, the light enters a second objective lens 61, by which an image of the object 60 to be observed is produced on the image pickup surface of a CCD camera 62. The activity at the wafer illumination light side is similar to that shown in FIG. 2 or 3.

For adjustment of wafer illumination light before an interference image is produced, a light blocking member 63 is inserted into the light path, and the reflection factor of the object 60 is detected.

Next, the reference light for providing an observation image as an interference image, will be described.

The light transmitted through the beam splitter 58 is reflected by a mirror 77, and it is used as reference light. Here, the mirror 77 is disposed at a plane optically conjugate with the object 60 to be observed. The reflected light from the mirror is then reflected by the beam splitter 58, and by means of the second objective lens 61, it is projected on the image pickup surface of the CCD camera 62 as reference light.

On the basis of the reflection image from the object 60 described above and of this reference light, an interference image is produced. Here, a plurality of attenuation filters 54 are mounted between the beam splitter 58 and the mirror 77, for adjustment of the reference light.

As a method of adjusting the reference light, there is a method in which a number of attenuation filters having different transmission factors are used as an appropriate filter having an optimum transmission factor may be selected and inserted, in accordance with the reflection factor of the wafer. In the case of FIG. 7, the attenuation filters 64 include a high transmission filter 65, a medium transmission filter 66 and a low transmission filter 67, wherein they may be selectively used in accordance with the reflection factor of the object to be observed.

Here, since the reference light passes the attenuation filter 64 twice, each of the filters 65, 66 and 67 functions to decrease the light quantity by an amount corresponding to the square of the respective transmission factor.

Selective use for attenuation filters having different transmission factors may be predetermined in a manual. However, it may be determined by use of the object 60, prior to production of an interference image. This facilitates easy and high speed measurement. To this end, the light blocking member 63 is mountably and demountably inserted between the beam splitter 58 and the mirror 77. No particular positional relation should be defined between the light blocking member 63 and the attenuation filters 64.

First, the light blocking member 63 is inserted into the light path. This results in that the observed image is not an interference image but a conventional bright-field image. Therefore, the reflection factor of the object 60 being observed can be detected from the output of the CCD camera 62 as well as the light adjusting condition. Also, an optimum light attenuation filter can be chosen. By using it and be retracing the light blocking member 63 out of the light path, an interference image of good visibility can be obtained.

A filter having a zero transmission factor may be included in the attenuation filters 64, and it may be used as a light blocking member. Alternatively, a separate inserting/retracting mechanism may be used.

In the manner described above, the inconveniences involved in the prior art can be removed. For a variable reflection factor of the object 60 to be observed, an interference image of good visibility can be produced stably.

It should be noted here that, since the interference image is changeable with the posture of the attenuation filter 64 inserted, the posture control and component precision should be controlled exactly.

As an example, a single glass plate may be coated with chromium with a thickness which changes so that it provides a continuously changing transmission factor. By rotating this glass plate, the reference light can be adjusted. Such an optical element is commercially available as a continuous ND (Neutral Density) filter.

Embodiment 2

An alternative is a structure that, under the condition that a polarization beam splitter is used, a quarter waveplate at the reference light side is rotated to adjust the reference light. High precision posture control is necessary in this case, like the embodiment of using attenuation filters having different transmission factors. FIG. 8 shows this example.

Light emitted from one of laser the light sources 51, 52 and 53 passes through a rotary diffusion plate 54, being rotated for incoherence transformation. The light is diffused and enters a fiber 55. The light is guided by the fiber and is emitted therefrom. Then, the light enters an optical rod as an illumination uniforming element and a computer hologram 57 having a function as a high efficiency diffusion plate. Then, the light is reflected by a polarization beam splitter 70. The light reflected by the polarization beam splitter 70 is transformed by relay lens 71 into parallel light, which is then transformed by a quarter waveplate 72 into circularly polarized light. Subsequently, the light enters an infinity-corrected objective lens 73, and it illuminates an object 60 to be observed, such as a wafer, for example.

The light reflected by the object 60 again enters the objective lens 73 and the quarter waveplate 72, whereby it is transformed into P-polarized light. It passes through the relay lens 71 and, now, it is transmitted by the polarization beam splitter 70. After this, the light passes through a quarter waveplate 74 and an erector 75, whereby an image of the object 60 is formed on the image pickup surface of a CCD camera 62. The activity at the wafer illumination light side is similar to that shown in FIG. 2, 3, or 7.

On the other hand, as regards the reference light for providing an interference image, after being transmitted by the polarization beam splitter 70, the light is transformed by a rotatable quarter waveplate 76 into circularly polarized light. It is then reflected by a mirror 77. Here, the mirror 77 is disposed at a plane optically conjugate with the object 60 to be observed. The reflected light is now transmitted through the quarter waveplate 76, by which it is transformed into S-polarized light. It is then reflected by the polarization beam splitter 70, and it passes through the quarter waveplate 74. Then, by means of the erector 75, it is projected on the image pickup surface of the CCD camera 14 as reference light.

On the basis of the reflection image from the object 60 described above and of this reference light, an interference image is produced. Here, for adjustment of the reference light, the quarter waveplate 76 described above is provided with a rotating mechanism.

Further, for adjustment of the wafer illumination light prior to formation of an interference image, a light blocking member 63 is inserted into the light path, and the reflection factor of the object 60 is detected. This is similar to the first embodiment (FIG. 7). On the basis of the information obtained thereby, the quarter waveplate 76 is rotated to adjust the light quantity of the reference light.

In accordance with this embodiment, an interference image can be produced, and thus, the image has better contrast as compared with an image based only on the bright-field illumination.

There may be cases where the posture control of an optical element is not desired. In consideration of this, a light adjusting method which does not need driving an optical element will be described below.

An example of such a light adjusting method uses a liquid crystal shutter or the like. However, when polarization is utilized in an optical system for forming an image by using reflection light from a wafer, for prevention of a loss of light quantity, the structure using a liquid crystal shutter may lead to complicatedness.

Embodiment 3

An EO (electro-optical) device may be used for the reference light adjustment, to best increase the visibility of an interference fringe in accordance with the reflection factor of a wafer. FIG. 9 shows such an embodiment.

Figure 8:
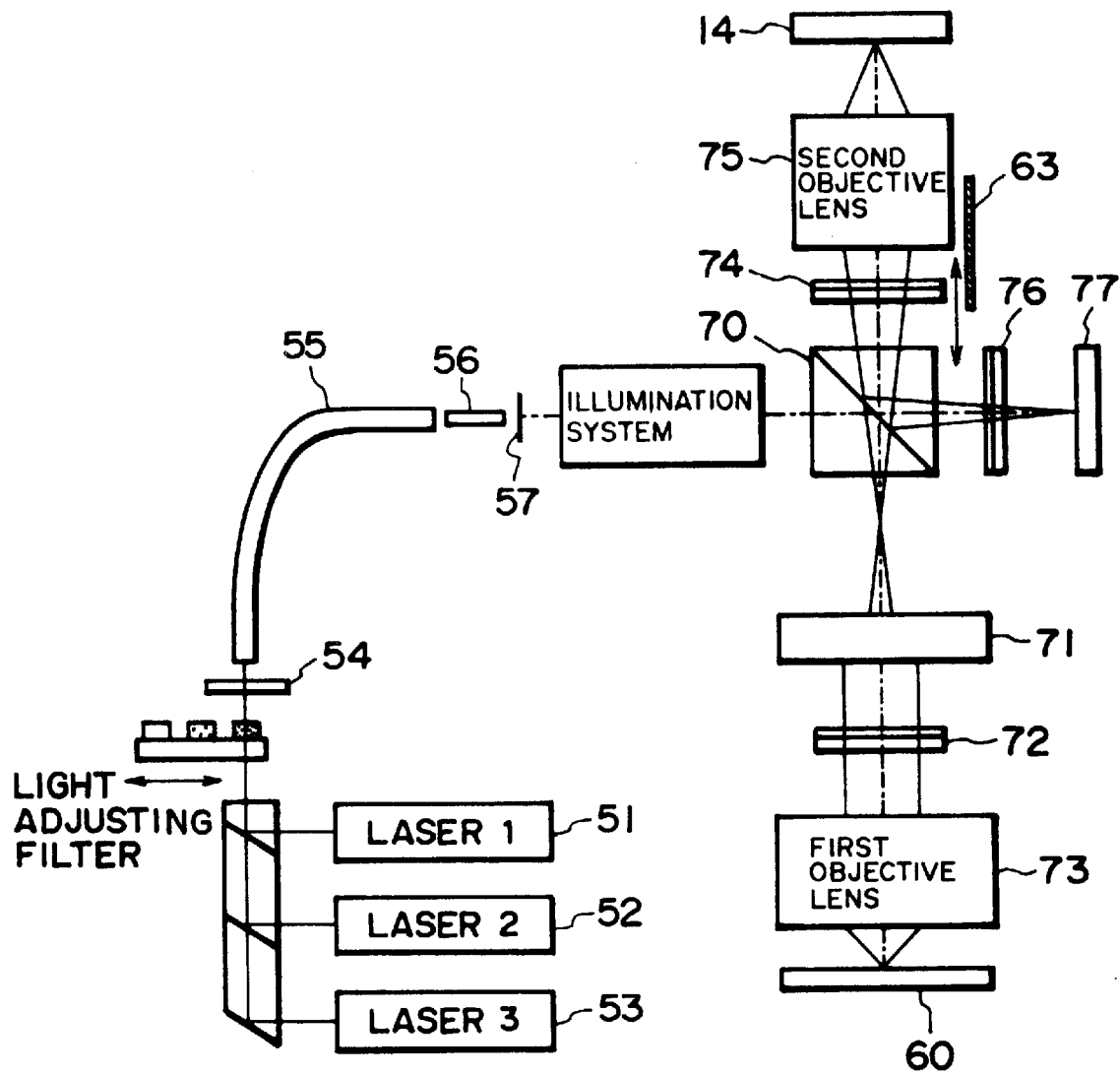
FIG. 8 is a schematic view of another embodiment of the first structure according to the present invention, and it shows an example of a detecting system which uses a rotatable quarter waveplate for adjustment of reference light.
Figure 9:
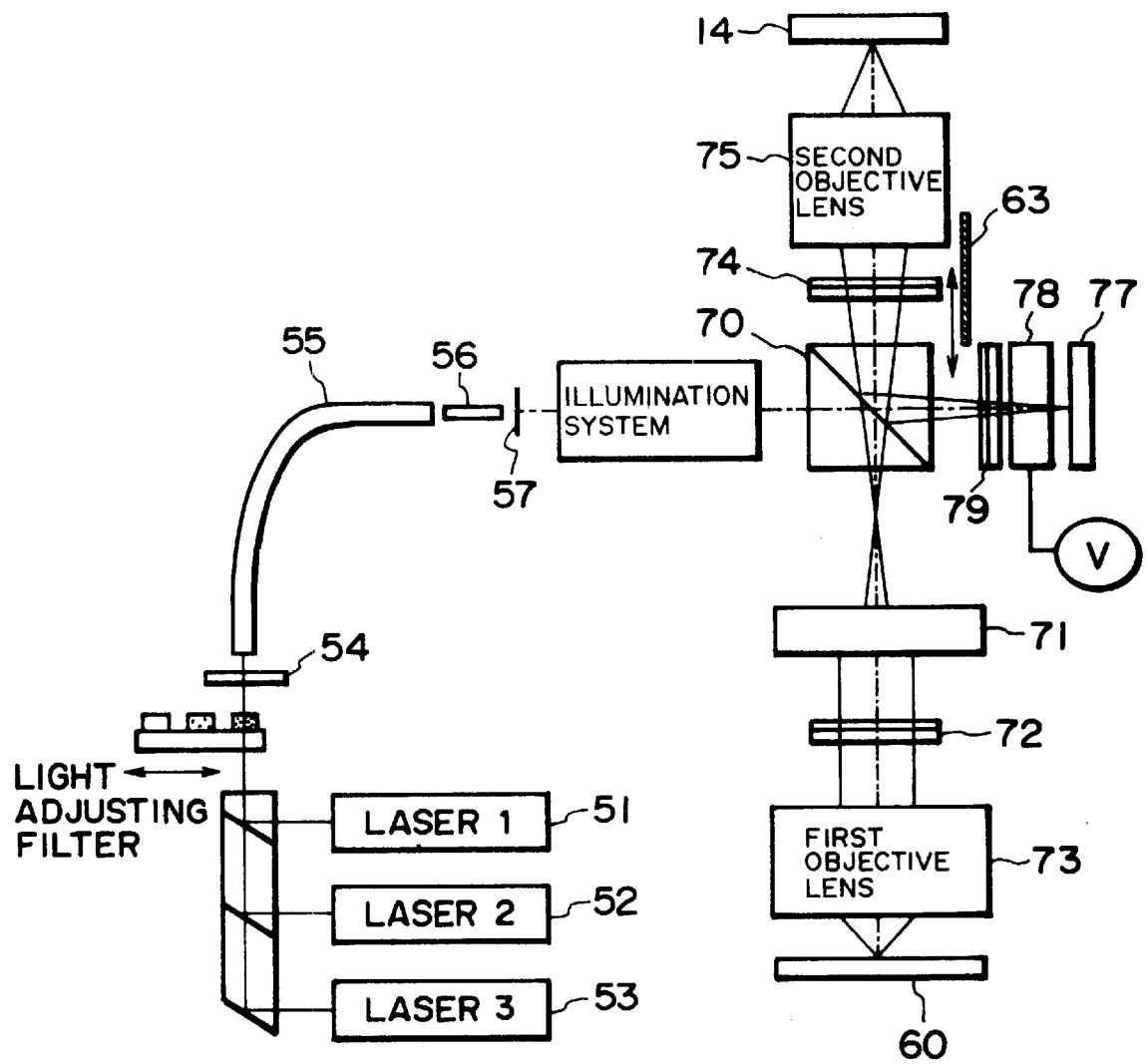
FIG. 9 is a schematic view of a further embodiment of the first structure according to the present invention, and it shows an example of a detecting system which uses an electro-optical device for adjustment of reference light.

In the structure shown in FIG. 9, the rotatable quarter waveplate shown in FIG. 8 is replaced by a quarter waveplate 79 which is not rotatable. An electro-optic device 78 is mounted between the quarter waveplate 79 and a mirror 77.

The electro-optical device 78 may comprise an element made of plumbic (lead) lanthanum zirconate titanate (PLZT), for example. In response to a high voltage applied, the state of polarization of light passing therethrough changes. In this embodiment, the optical system utilizes polarization. Therefore, a change in state of polarization of the reference light means that the quantity of light as the reference light reduces. The transmission factor and reflection factor of the optical elements may be set so that the visibility of an interference fringe upon the CCD camera 14 becomes highest when the reflection factor of the wafer (object to be observed) is 100%, in a case where no electric voltage is applied to the electro-optic device 78. On that occasion, the actual wafer reflection factor becomes less than 100%, and the structure is such that the reference light is reduced as well.

As a matter of course, the electro-optical device 78 may be used as an intensity modulator. The reference light may be adjusted thereby.

In place of an electro-optical device, an AO (acousto-optic) device may be used to modulate the intensity. The intensity of the reference light can be adjusted thereby.

The procedure for detecting the reflection factor of the object 60 and for setting an optimum reference light intensity, in the cases of using an electro-optic device and an acousto-optic device, is essentially the same as that described with reference to FIG. 7.

By using reference light adjusting means such as shown in FIG. 7, 8 or 9, an interference image of good visibility can be obtained stably, without being influenced by a change in reflection factor of the wafer.

Next, the principle of accomplishing high precision position detection by use of a system, being more inexpensive and compact than that of the first to third embodiments, will be described with reference to fourth to seventh embodiments of the present invention, and in conjunction with FIGS. 10–13.

Embodiment 4

Figure 10:
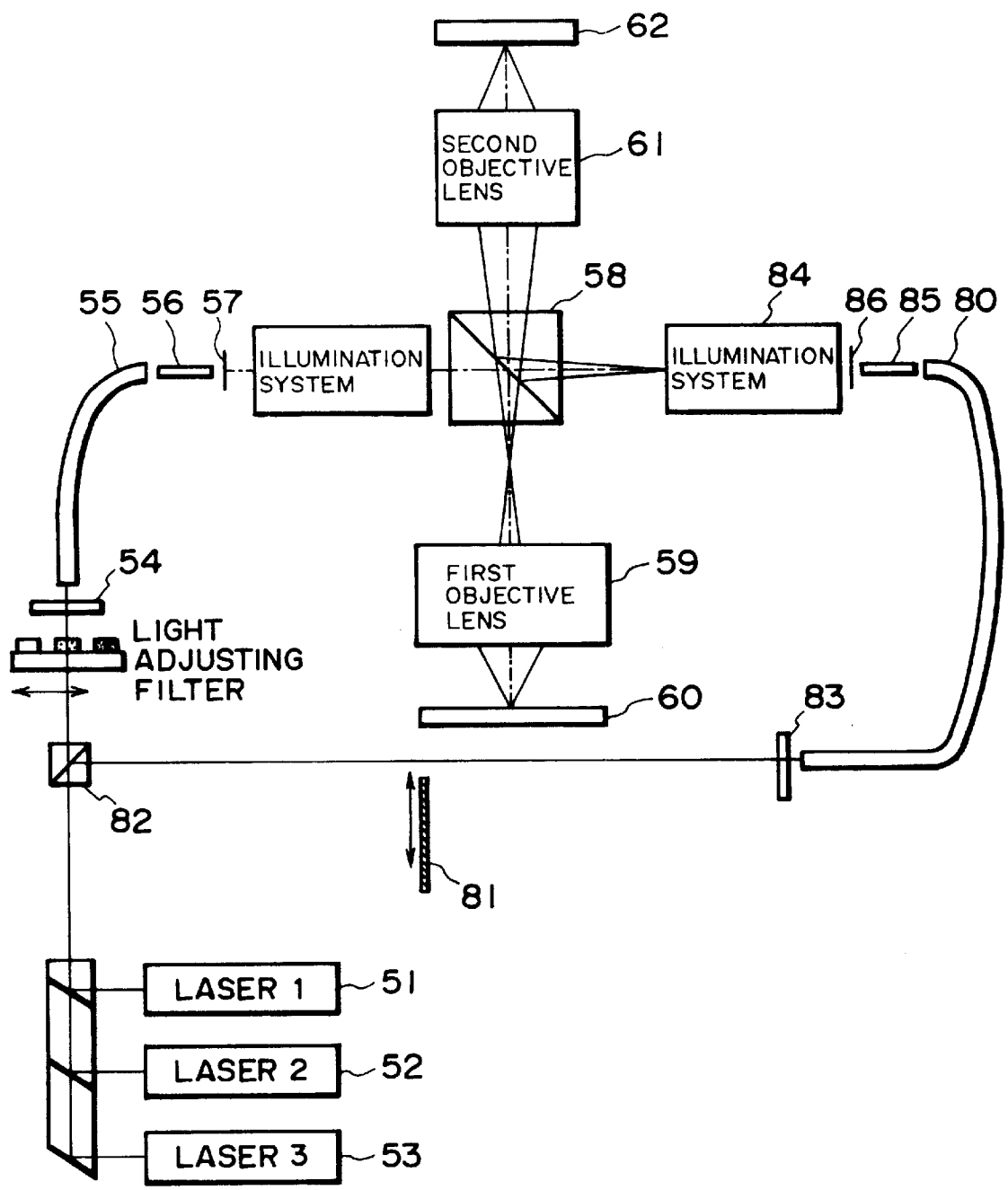
FIG. 10 is a schematic view of an embodiment of a second structure according to the present invention, and it shows an example of a detecting system in which the adjustment of reference light is unnecessary.

FIG. 10 shows an embodiment for explaining the principle of a position detecting system according to the present invention. FIG. 10 concerns an example in which there is a margin with respect to the light quantity, like the FIG. 7 embodiment. As regards a prism, a beam splitter 58 having no polarizing characteristic is used.

As regards the light source, this embodiment uses a He-Cd laser 51 (wavelength 441.6 nm), an Ar laser 52 (wavelength 514.6 nm) and a He-Ne laser 53 (632.8 nm), selectively. Light emitted from any one of these laser light sources 51, 52 and 53, being arranged for selective use, is divided by a beam splitter 82 into wafer illumination light and reference light.

One of them, i.e., the wafer illumination light passes through alight adjusting attenuation filter and then through a rotary diffusion plate 54 being rotated for the incoherency transformation, by which the light is diffused. The light then enters a fiber 55. The light goes through the fiber 55 and exits therefrom. After this, the light enters an optical rod 56 as an illumination uniforming element and a computer hologram 57 having a function as a high efficiency diffusion plate. Then, the light is reflected by a beam splitter 58.

A portion of the light reflected by the beam splitter 58 enters a finite-corrected first objective lens 59, and it illuminates an object 60 to be observed.

Light reflected by the object 60 again enters the first objective lens 59 and, now, it is transmitted by the beam splitter 58. Then, the light enters a second objective lens 61, by which an image of the object 60 to be observed is produced on the image pickup surface of a CCD camera 62. The activity at the wafer illumination light side is similar to that shown in FIG. 7.

As regards the reference light, the light emitted from a laser and reflected by the beam splitter 82 in FIG. 10 is used as the same. The light passes through a rotary diffusion plate 83, being rotated for incoherence transformations, and then it enters a fiber 80. The light is guided by the fiber 80 and, after being emitted therefrom, it passes through an optical rod 85 as an illumination uniforming element and a computer hologram 86 having a function as a high efficiency diffusion plate. Then, by means of an illumination system 84, the light is projected to illuminate a surface being optically conjugate with (a plane being in an imaging relation with) the surface of the wafer (object to be observed) 60. The light is reflected by the beam splitter 58, and it enters the second objective lens 61. By using this as reference light, an image of the object 60 to be observed is formed on the image pickup surface of the CCD camera 62.

For adjustment of light before an interference image is produced by using the reference light, a light blocking member 81 is inserted into the light path to prevent the reference light from being projected to the CCD camera 62, and then the reflection factor of the object 60 is detected. This is the same as in the FIG. 7 embodiment.

In the structure of this embodiment, the reference light does not need adjustment. The reason will be described below. However, as regards the CCD camera 62, it is used while keeping the taking-in times fixed. A case where the taking-in time is changed will be described later.

In the CCD camera 62, there is a voltage of saturation and, also, there is a light quantity corresponding to it. If this light quantity is denoted by Is, the light adjusting filter may be set so as to provide about 50% to 80% of the saturation light quantity Is upon the CCD camera 62 in accordance with the reflection factor of the wafer (although the proportion depends on the performance of the CCD camera). In other words, "adjusting the light" is such that, even if the reflection factor of the wafer changes, in the case of the interference image or in the case not using it, a certain light quantity of a certain range is projected on the CCD camera 62. Then, as regards the quantity of reference light, the structure may be such that, regardless of the adjustment of the wafer illumination light, constant reference light is projected on the CCD camera 62. This is the reason the reference light does not need adjustment.

As regards a method of adjusting the wafer illumination light, like the FIG. 7 embodiment, at the reference light side, a light blocking member 81 is inserted to prevent the light from impinging on the CCD camera 62. At the wafer illumination light side, among many attenuation filters having different transmission factors, an initial filter (having a transmission factor Ti) is inserted, and the output Ii of the CCD camera at that time is calculated.

Now, a conventional bright-field image, not an interference image, is considered. In order to obtain a light quantity which is 70% of the saturation light quantity Is, for example, the transmission factor Ti of an attenuation filter to be selected can be determined by:

$$Tf=0.7*Is*Ti/Ii.$$

Here, the transmission factor Ti of the initial filter should be smaller than the transmission factor Ti of the attenuation filter to be chosen. Otherwise, the initial light quantity Ti may become larger than the saturation light quantity Is and thus saturated. In order to avoid this, the reflection factor of a wafer to be detected may be predicted beforehand. If it cannot be predicted, a filter suitable for a wafer reflection factor of 10% or less may be used. This prevents saturation of the initial CCD camera output.

As a matter of course, if saturation occurs, an attenuation filter having a lower transmission factor may be selected, and this can be done in an automatic light adjusting sequence. However, since the sequence has to be executed without specifying a particular amount of lowering the transmission factor, the time for completing the sequence cannot be calculated. It may take a very long time.

As regards the attenuation filters, when those filters have discrete or discontinuous transmission factors are used, one with which the adjusted light quantity becomes in a range of 50%–80% of the saturation light quantity, may be chosen.

As for the interference image, since the image intensity is determined by the interference between the reflection light from the wafer and the reference light, the sum of amplitudes of them should be considered, rather than the sum of light quantities of them.

Thus, as regards the light quantities of the reference light and also of the reflection light, in order to obtain an interference image, the quantity of light to be projected on the CCD camera should be not greater than one-fourth (¼) of the respective saturation light quantities Is.

With the arrangement described above, inconveniences involved in the conventional methods can be removed, and an interference image having a good visibility can be obtained while meeting a change in the reflection factor of the object 60 being observed.

Embodiment 5

Figure 11:
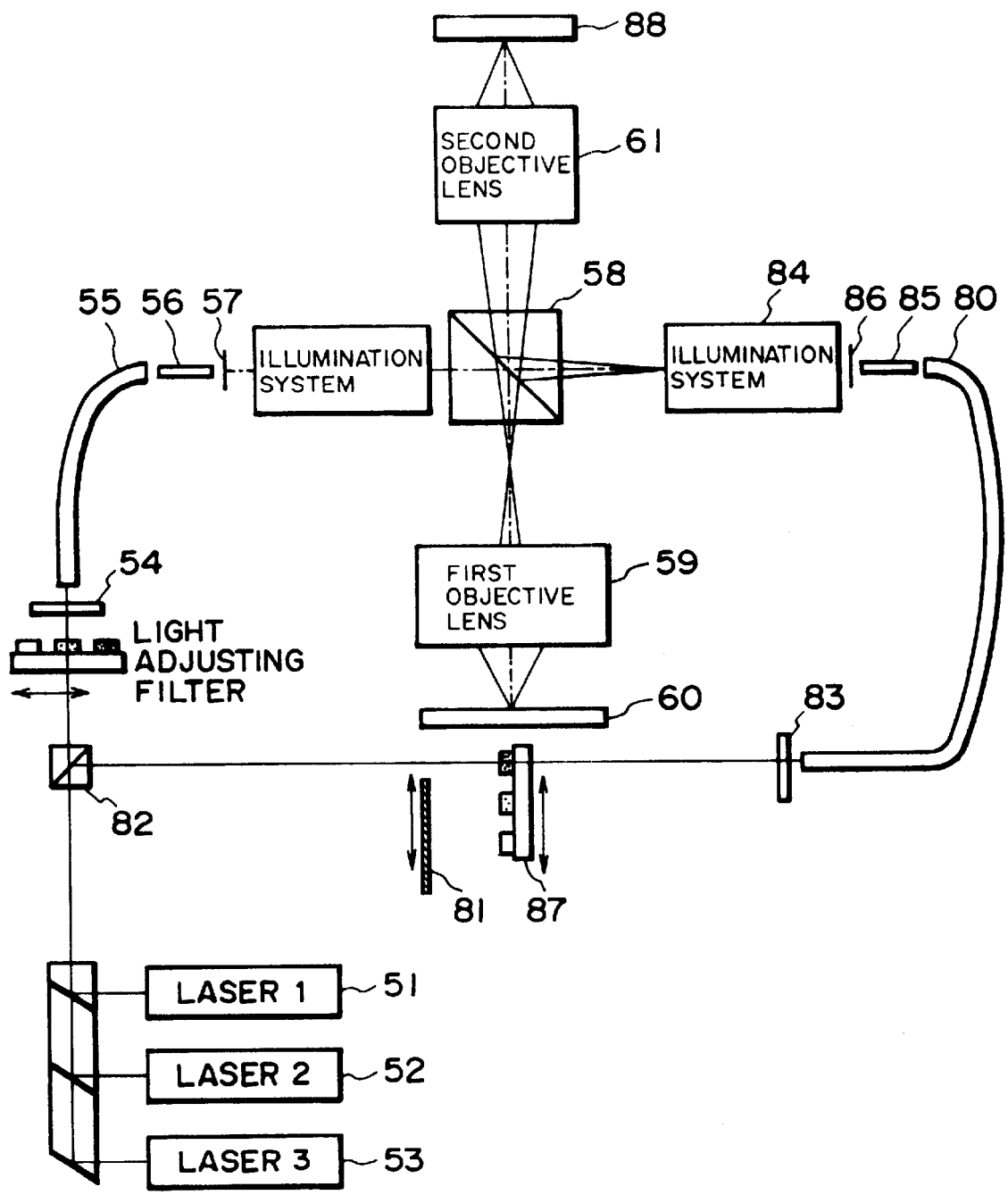
FIG. 11 is a schematic view of another embodiment of the second structure according to the present invention, and it shows an example of a detecting system in which adjustment of reference light is made outside the detecting system and only with respect to a change in taking time of an image pickup device.

FIG. 11 shows an embodiment which is arranged to perform light adjustment, while changing the taking-in time of an image pickup device.

As has been described with reference to FIG. 10, if the taking-in time of the image pickup device is constant, the reference light may be constant. However, when the taking-in time of the image pickup device is changed, the light quantity of the reference light should be adjusted accordingly.

As shown in FIG. 11, the light emitted from one of light source lasers 51, 52 and 53 is divided by a beam splitter 82 into a wafer (object 60) illumination light and reference light. Like the wafer illumination light, the reference light is received by a light adjusting filter 87 before it enters a fiber 80.

With the provision of the light adjusting filter 87 before the fiber 80 and also before a rotary diffusion plate 83, the system can be free of the precision of components between attenuation filters or of the posture precision responsive to the filter interchanging. Therefore, the system can be sufficiently inexpensive. Since the adjustment of the reference light is accomplished between the light source 51, 52 or 53 and the fiber 80, not performed inside the detecting system, an error attributable to enlargement in space of the detecting system can be avoided.

Embodiment 6

Figure 12:
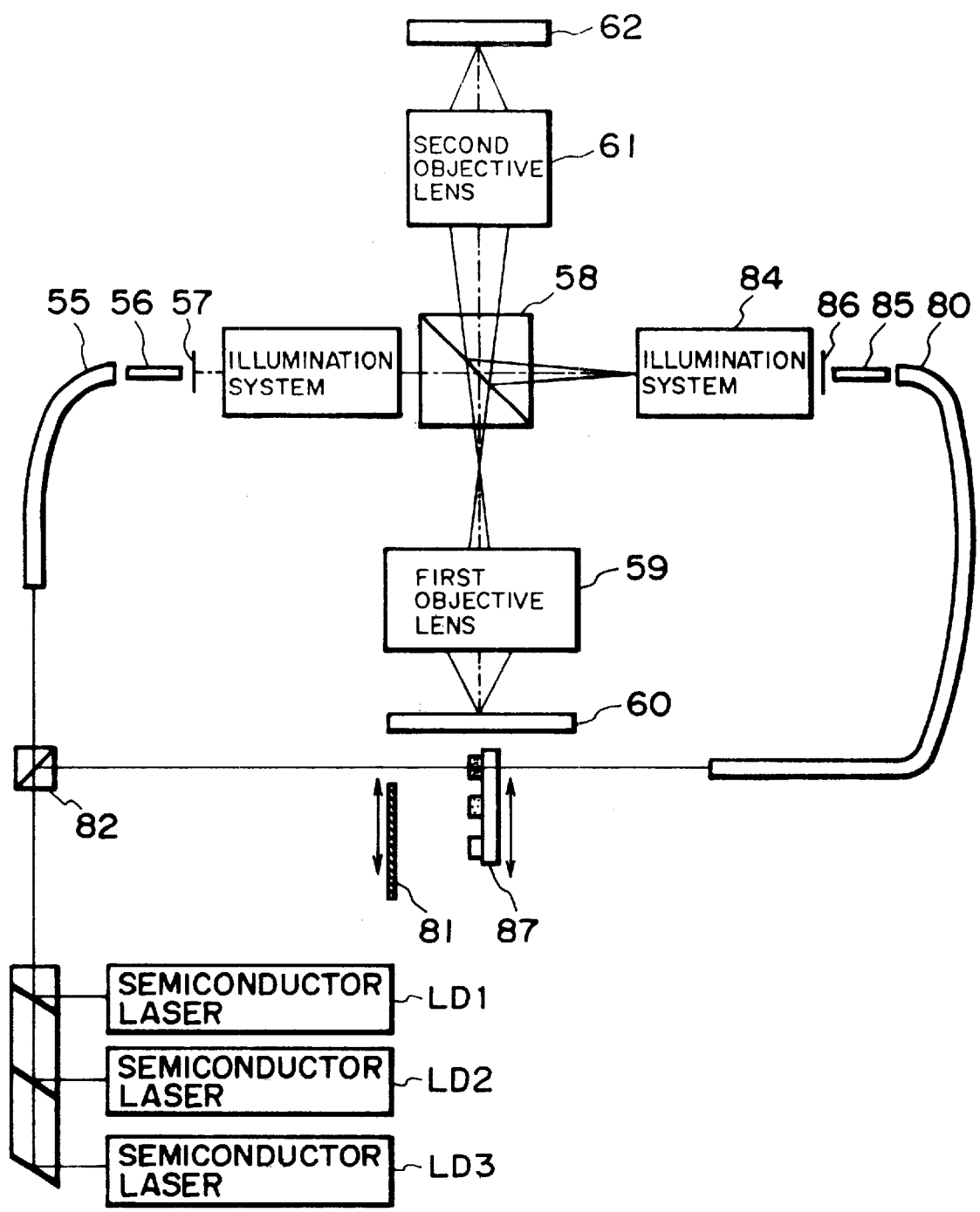
FIG. 12 is a schematic view of another embodiment of the second structure according to the present invention, and it shows an example of a detecting system in which a semiconductor laser of pulse emission type is used and in which mechanical adjustment is made to reference light.

FIG. 12 shows an embodiment of the present invention in which semiconductor lasers LD1, LD2 and LD3 are used as a light source.

As regards the three semiconductor lasers, the emission wavelengths of these lasers LD1–LD3 may be chosen in the combination of 685 nm, 785 nm and 830 nm, for example.

In this embodiment, the semiconductor laser is pulse-oscillated and, by changing the frequency thereof, the quantity of light to be projected to a CCD camera 62 is changed, so that the reflection light from a wafer (object 60 to be observed) has a predetermined light quantity. In this case, the reference light is adjusted.

Although this embodiment uses a CCD camera 62, since the wafer illumination light can be adjusted by the frequency of pulse light emission while the reference light can be adjusted by using a light adjusting filter 87, the system can meet changing the taking-in time of the image pickup device.

Embodiment 7

Figure 13:
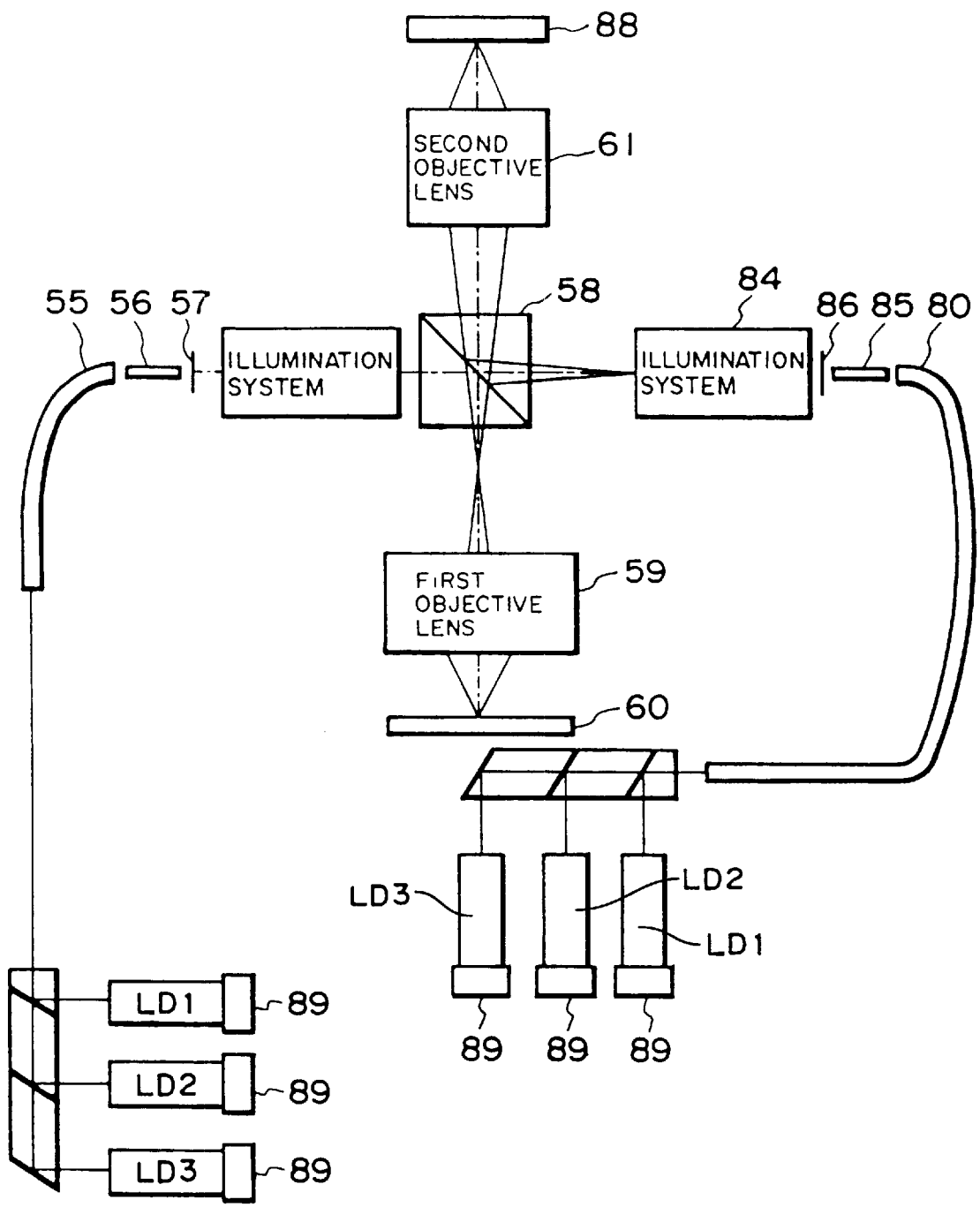
FIG. 13 is a schematic view of another embodiment of the second structure according to the present invention, and it shows the structure of a detecting system in which independent semiconductor lasers are used for illumination of a wafer and for providing reference light.

FIG. 13 shows an embodiment in which semiconductor lasers are provided separately for the wafer (object 60 to be observed) illumination light and for the reference light.

In each light source, a semiconductor laser is pulse-oscillated and, by changing the frequency thereof, the light quantity can be changed. Thus, the system can meet changing the taking-in time of the image pickup device 88, like the sixth embodiment shown in FIG. 12.

In this example, with the same type of semiconductor lasers, no interference fringe is produced just by superposing two emitted light beams from separate semiconductor lasers. This is because, even for two semiconductor lasers of the same type, the emission wavelengths of them differ from each other due to a difference in materials used or a difference in environment such as temperature, for example.

In consideration of it, in this embodiment, in order to assure interference between the lasers, semiconductor lasers having been made from one and the same wafer are used. Also, peltier elements 89 should be used to perform temperature control. This is similar to what has been adopted in the field of coherence optical communication.

Embodiment of Semiconductor Manufacturing System

Next, an embodiment of a manufacturing system for manufacturing semiconductor devices such as semiconductor chips (e.g., IC or LSI), liquid crystal panels, CCDs, thin film magnetic heads, or micro-machines, for example, will be described. This system is arranged so that repair of any disorder occurring in a production machine placed in a semiconductor manufacturing factory or periodic maintenance thereof or, alternatively, a maintenance service such as software supply, can be made by use of a computer network outside the manufacturing factory.

Figure 14:
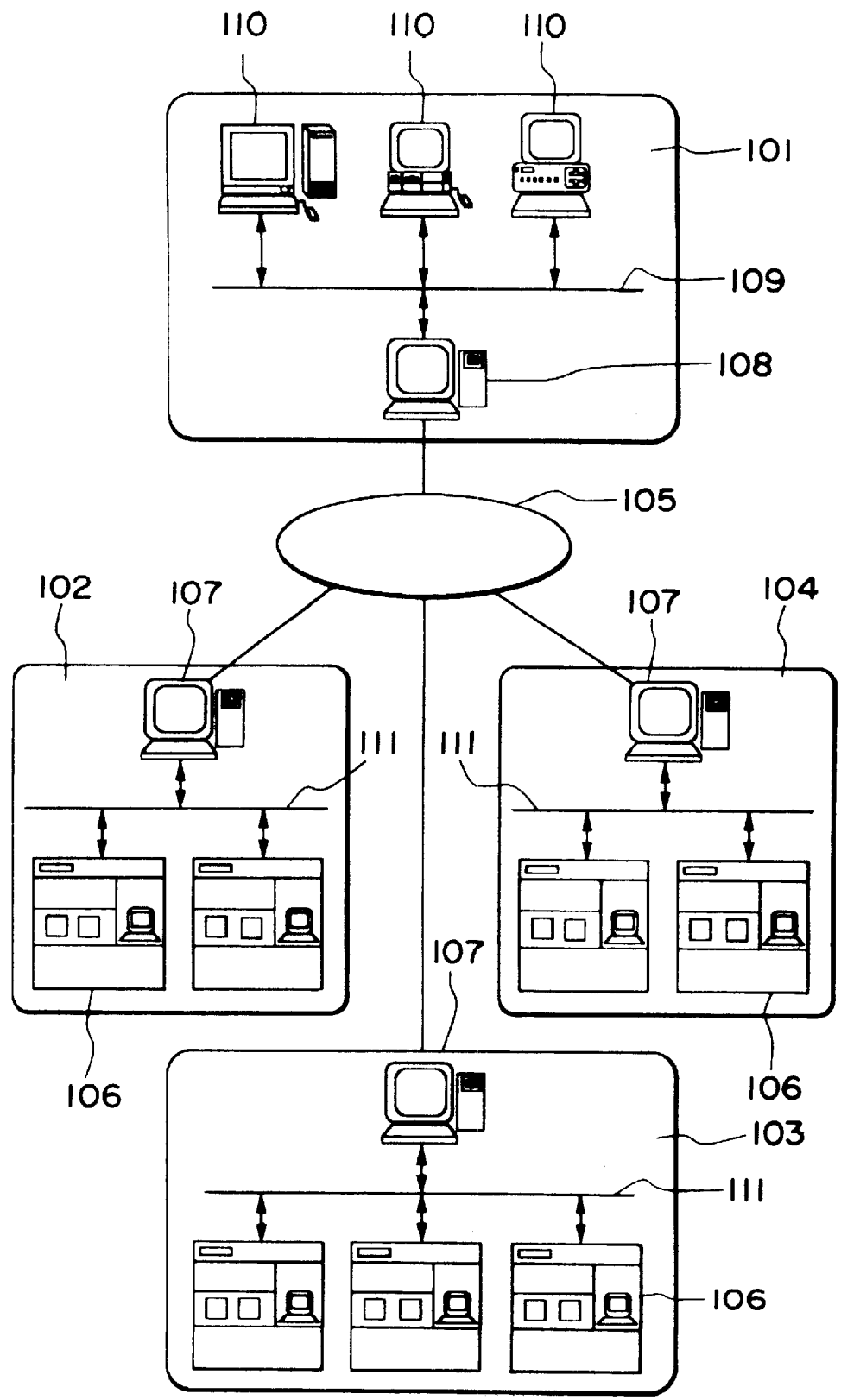
FIG. 14 is a schematic view of a semiconductor manufacturing system, in a certain aspect thereof.

FIG. 14 is a schematic view of a general structure of the production system, in a certain aspect thereof. Denoted in the drawing at 101 is a business office of a vendor (machine supplying maker) for providing semiconductor device manufacturing apparatuses. As examples of such production machines, here, pre-process machines (various lithographic apparatuses such as an exposure apparatus, a resist coating apparatus, an etching apparatus, for example, as well as a heat treatment apparatus, a film forming apparatus, and a flattening apparatus) and post-process machines (an assembling machine and an inspection machine, for example) are assumed. Inside the business office 101, there are a host control system 108 for providing a maintenance database for the production machines, plural operating terminal computers 110, and a local area network (LAN) 109 for connecting them to constitute an intranet. The host control system 108 is provided with a gateway for connecting the LAN 109 to an internet 105 which is an outside network of the office, and a security function for restricting the access from the outside.

On the other hand, denoted at 102–104 are plural manufacturing factories of a semiconductor manufacturer or manufacturers as a user (users) of production machines. The factories 102–104 may be those which belong to different manufacturers or to the same manufacturer (e.g., they may be a pre-process factory and a post-process factory). In each of the factories 102–104, there are production machines 106, a local area network (LAN) 111 for connecting them to constitute an intranet, and a host control system 107 as a monitoring system for monitoring the state of operation of the production machines 106. The host control system 107 in each factory 102–104 is provided with a gateway for connecting the LAN 111 in the factory to the internet 105 which is an outside network of the factory. With this structure, the host control system 108 of the vendor 101 can be accessed from the LAN 111 in each factory, through the internet 105. Further, due to the security function of the host control system 108, only admitted users can gain access thereto. More specifically, through the internet 105, status information representing the state of operation of the production machines 106 (for example, the state of the machine in which any disorder has occurred) may be transmitted as a notice from the factory to the vendor. Additionally, any response information which is responsive to the notice (that is, for example, information on how the disorder should be treated or software data concerning the treatment) as well as a latest software program and maintenance information such as help information, may be supplied from the vendor. The data communication between each factory 102–104 and the vendor 101 as well as the data communication through the LAN 111 in each factory, may use a communication protocol (TCP/IP) generally used in the internet. In place of using the internet, an exclusive line network (e.g., ISDN) controlled with a strictest security that access by a third party is not allowed, may be used. Further, the host control system is not limited to the system as provided by the vendor. A database may be structured by the user and it may be set in an outside network, such that it can be accessed from plural user factories.

Figure 15:
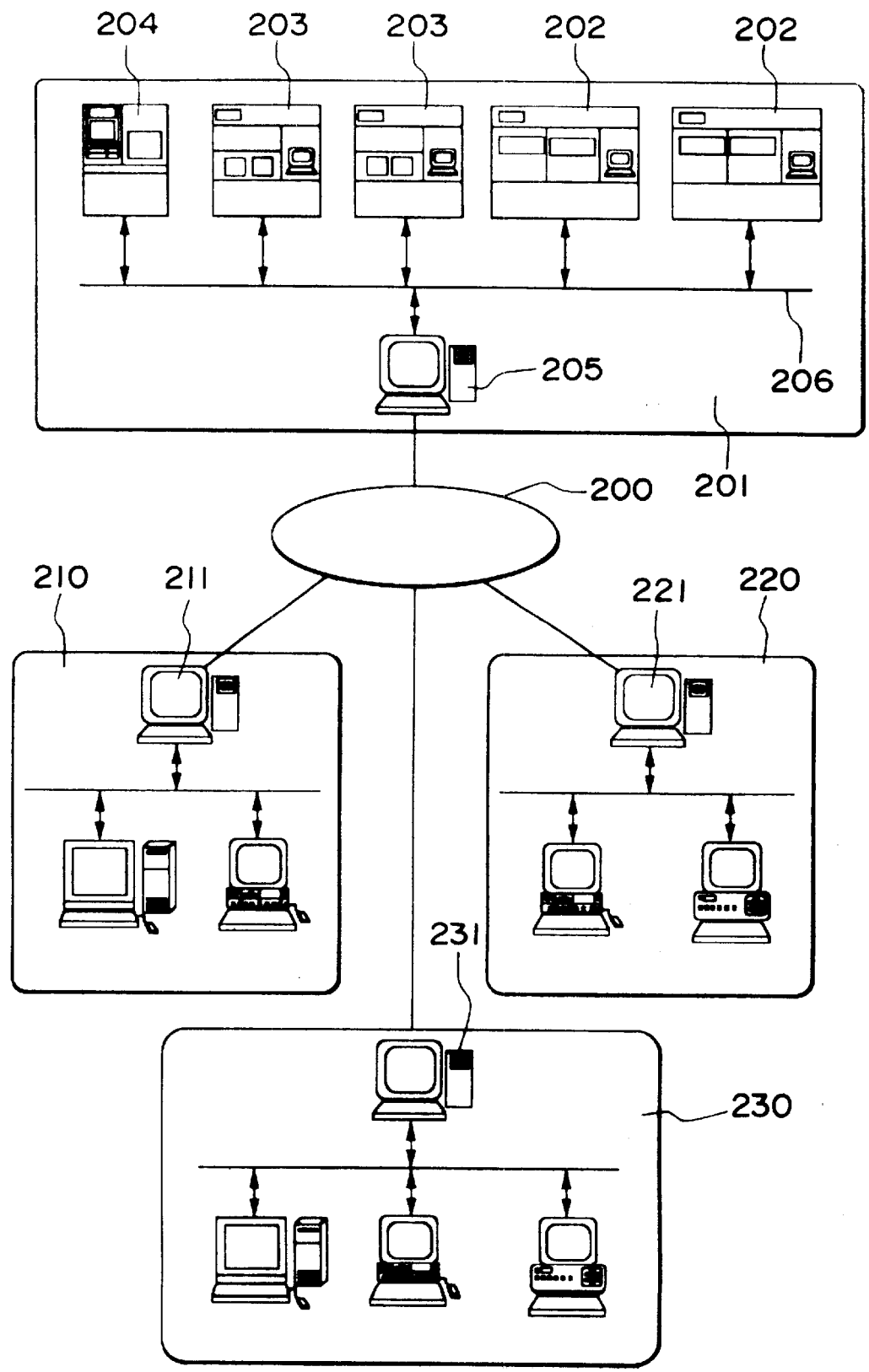
FIG. 15 is a schematic view of a semiconductor manufacturing system, in another aspect thereof.

FIG. 15 is a schematic view of a general structure of the production system according to this embodiment, in another aspect thereof different from that of FIG. 14. In the preceding example, plural user factories each having production machines and the control system of the vendor of the production machines are connected with each other through an external network, so that, through this external network, information related to the production control in each factory or information related to at least one production machine can be data communicated. IN this example, as compared therewith, a factory having production machines supplied from different vendors and control systems of these vendors corresponding to the user production machines are connected with each other through an external network, outside the factory, so that the maintenance information for these production machines can be data communicated.

Denoted in the drawing at 201 is a manufacturing factory of a production machine user (i.e., a semiconductor device manufacturer). Along the production line in the factory, there are many production machines for performing various processes, that is, in this example, an exposure apparatus 201, a resist processing apparatus 203, and a film formation processing apparatus 204 introduced. Although only one factory 201 is illustrated in the drawing, in practice, plural factories may be arranged into the network. Each production machine in the factory is connected through a LAN 206 to constitute an intranet. The operation of the production line is controlled by a host control system 205.

On the other hand, in the business offices of vendors (machine supplying makers) such as an exposure apparatus manufacturer 210, a resist processing machine manufacturer 220, and a film forming machine manufacturer 230, for example, there are host control systems 211, 221 and 213 for performing remote control maintenance for the machines they supplied. Each of these host control systems is equipped with a maintenance database and a gateway for the outside network. The host control system 205 for controlling the machines in the user factory and the control systems 211, 221 and 231 of the machine vendors are connected with each other through the external network 200 (internet) or an exclusive line network. If, in this production system, any disorder occurs in any one of the production machines in the production line, the operation of the production machine is stopped. However, this can be met quickly through the remote control maintenance for the disordered machine, form the corresponding machine vendor and by way of the internet 200. Therefore, the suspension of the production line is short.

Figure 16:
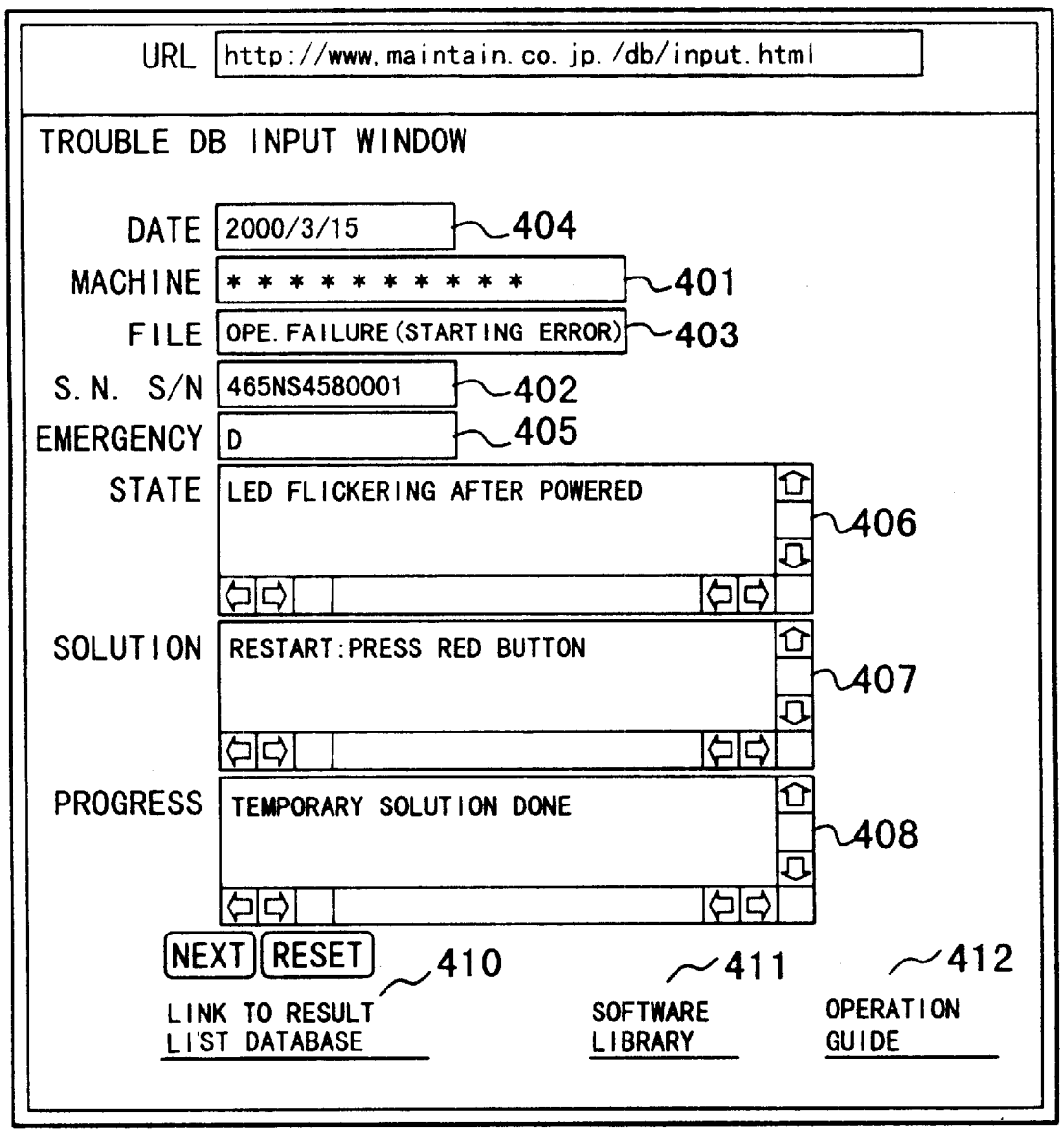
FIG. 16 is a schematic view of an example of a user interface.

Each of the production machines in the factory may have a display, a network interface and a computer for executing network accessing software, stored in a storage device, as well as machine operating software. The storage device may be an internal memory or a hard disk or, alternatively, it may be a network file server. The network accessing software may include an exclusive or wide-use web browser, and a user screen interface such as shown in FIG. 16, for example, may be provided on the display. Various data may be inputted into the computer (input zones on the screen) by an operator who controls the production machines in each factory, such as, for example, machine type (401), serial number (402), trouble file name (403), date of disorder (404), emergency level (405), status (406), solution or treatment (407), and progress (408). The thus inputted information is transmitted to the maintenance database through the internet. In response, appropriate maintenance information is replied from the maintenance database to the user's display. Further, the user interface as provided by the web browser enables a hyperlink function (410–412) as illustrated. As a result, the operator can access further details of information in each item, or he/she can get a latest version of the software to be used for the production machine, from the software library as provided by the vendor. Alternatively, the operator can get an operation guide (help information) prepared for factory operators.

Next, a semiconductor device manufacturing process which uses the production system described above, will be explained.

Figure 17:
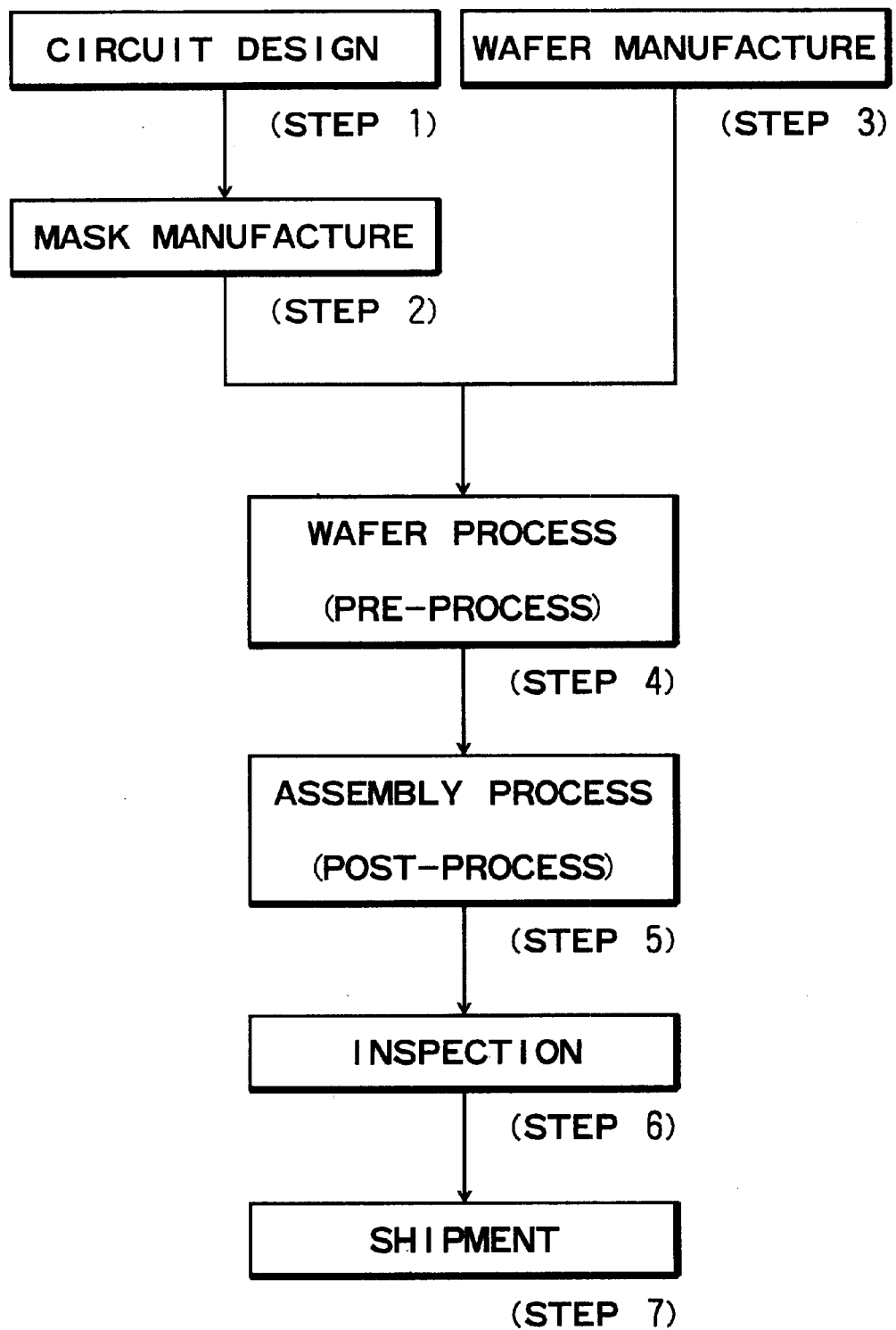
FIG. 17 is a flow chart of device manufacturing processes.

FIG. 17 is a flow chart of a general procedure for the manufacture of microdevices.

Step 1 is a design process for designing a circuit of a semiconductor device. Step 2 is a process for making a mask on the basis of the circuit pattern design. Step 3 is a process for preparing a wafer by using a material such as silicon. Step 4 is a wafer process (called a pre-process) wherein, by using the so prepared mask and wafer, circuits are practically formed on the wafer through lithography. Step 5 subsequent to this is an assembling step (called a post-process) wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devcies are completed and they are shipped (step 7).

The pre-process and the post-process may be performed in separate exclusive factories. In each factory, the maintenance is carried out on the basis of the remote maintenance system described hereinbefore. Further, between the pre-process factory and the post-process factory, data communication for the information related to the production control and the machine maintenance may be done by use of the internet or an exclusive line network.

FIG. 18 is a flow chart showing details of the wafer process.

Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

Since the machines used in these processes are maintained through a remote maintenance system as described above, any disorder may be prevented beforehand. If it occurs, it can be met quickly. Therefore, the device productivity can be improved significantly.

While the invention has been described with reference to the structures disclosed herein, it is not confined to the details set forth and this application is intended to cover such modifications or changes as may come within the purposes of the improvements or the scope of the following claims.

What is claimed is:

1. A position detecting method for measuring a position of a pattern formed on an object to be observed, said method comprising the steps of:

providing incoherence-transformed illumination light for illuminating the pattern surface of the object by use of coherent light, and incoherence-transformed reference light;

changing the quantity of the reference light in accordance with a reflection factor of the pattern surface; and imaging reflection light from the pattern surface and reference light reflected by a conjugate mirror, together, upon a photoelectric converting element, and measuring the position of the pattern on the basis of an interference image signal obtainable by the imaging.

2. A method according to claim 1, wherein a beam splitter is used to divide light from a coherent light source into the illumination light and the reference light.

3. A method according to claim 2, wherein the reference light is reflected by a conjugate mirror disposed at a plane optically conjugate with the pattern surface of the object.

4. A method according to claim 3, wherein a movable light blocking member is disposed between the beam splitter and the conjugate mirror, the reflection factor of the pattern surface is measured while the reference light is kept blocked by the light blocking member, the light quantity of the reference light is adjusted on the basis of the measurement of the reflection factor, and the position of the pattern is measured while moving the light blocking member out of a light path so that it does not block the reference light.

5. A method according to claim 3, wherein the beam splitter is a polarization beam splitter, a rotatable quarter waveplate is disposed between the conjugate mirror and the polarization beam splitter, and the light quantity of the reference light is adjusted by rotating the quarter waveplate.

6. A method according to claim 3, wherein a plurality of light attenuating filters having different transmission factors and being insertable and retractable into and out of a light path are provided between the conjugate mirror and the beam splitter, and wherein the light quantity of the reference light is adjusted on the basis of a selection of one of the attenuation filters to be inserted into the light path of the reference light.

7. A method according to claim 3, wherein the beam splitter is a polarization beam splitter, a quarter waveplate and an electro-optic element are disposed between the conjugate mirror and the polarization beam splitter, and the light quantity of the reference light is adjusted by using the electro-optic element.

8. A method according to claim 3, wherein the beam splitter is a polarization beam splitter, a quarter waveplate and an acousto-optic element are disposed between the conjugate mirror and the polarization beam splitter, and the light quantity of the reference light is adjusted by using the acousto-optic element.

9. A method according to claim 2, wherein a rotatable diffusion plate is disposed between the light source and a fiber for directing light from the light source to an optical system including the beam splitter, to transform the coherent light into incoherent light.

10. A method according to claim 1, having a plurality of light attenuating filters having different transmission factors and being insertable and retractable into and out of a light path are provided between the light source and a fiber for directing the illumination light to an optical system, and wherein the light quantity of the illumination light is adjusted on the basis of a selection of one of the attenuation filters to be inserted into the light path of the illumination light.

11. A method according to claim 1, wherein a semiconductor laser for emitting pulse light is provided as the light source, and wherein the light quantity of the illumination light is adjusted by changing a frequency of the pulse light.

12. A method according to claim 1, wherein the position of the pattern is measured on the basis of an image produced with a focus with which a difference in reflection factor between surface levels of a pattern portion of the object and of a non-pattern portion of the object becomes largest.

13. A position detection method for measuring a position of a pattern formed on an object to be observed, said method comprising the steps of:
providing, by use of coherent light, illumination light for illuminating the pattern surface of the object and reference light effective to provide an interference image on the basis of a pattern image to be taken by use of the illumination light;
illuminating the pattern surface with the illumination light being incoherence-transformed, and combining the incoherence-transformed reference light and reflection light from the pattern surface to image them upon a photoelectric converting element;
changing the quantity of the illumination light; and
measuring the position of the pattern on the object on the basis of a signal from an interference image as formed on the photoelectric converting element.

14. A method according to claim 13, wherein the adjustment of the light quantity is performed between a light source and a first fiber for directing the illumination light toward the object side.

15. A method according to claim 13, wherein the light quantity of the reference light and a signal taking-in time for the interference image signal are adjusted in accordance with a reflection factor of the pattern surface.

16. A method according to claim 15, wherein a movable light blocking member for blocking the reference light is provided, the reflection factor of the pattern surface is measured while the reference light is kept blocked by the light blocking member, a light adjusting condition is determined on the basis of the measurement of the reflection factor, and the light quantity of the reference light is adjusted in accordance with the determined light adjusting condition.

17. A method according to claim 16, wherein the light blocking member is disposed between a beam splitter, for dividing light from a light source, and a second fiber for directing the reference light and the reflection light toward the light combining position side.

18. A method according to claim 17, wherein a plurality of light attenuating filters having different transmission factors and being insertable/retractable into and out of a light path are provided between the beam splitter and the second filter, and wherein the light quantity of the reference light is adjusted on the basis of a selection of one of the light attenuating filters to be inserted into the light path.

19. A method according to claim 17, wherein a rotatable diffusion plate is disposed between the light source and the first or second fiber, to transform the coherent light into incoherent light.

20. A method according to claim 13, wherein a plurality of light attenuating filters having different transmission factors and being insertable and retractable into and out of a light path are provided between the light source and a fiber for directing the illumination light to an optical system, and wherein the light quantity of the illumination light is adjusted on the basis of a selection of one of the attenuation filters to be inserted into the light path of the illumination light.

21. A method according to claim 13, wherein a semiconductor laser for emitting pulse light is provided as the light source, and wherein the light quantity of the illumination light is adjusted by changing a frequency of the pulse light.

22. A method according to claim 13, wherein the position of the pattern is measured on the basis of an image produced with a focus with which a difference in reflector factor between surface levels of a pattern portion of the object and of a non-pattern portion of the object becomes largest.

23. A position detecting method for measuring a position of a pattern formed on an object to be observed, said method comprising the steps of:
providing at least a pair of light sources for emitting mutually coherent light beams, wherein a light quantity of at least one of them is adjustable;
transforming illumination light emitted from one of the light sources into incoherent light, and projecting the same to the pattern surface of the object;
transforming reference light emitted from the other light source into coherent light, and projecting the same to a conjugate plane being optically conjugate with the pattern surface; and
imaging reflection light from the pattern surface and the reference light from the conjugate plane, together, upon a photoelectric converting element, and measuring the position of the pattern on the object on the basis of a signal from an interference image obtainable by the imaging.

24. A method according to claim 23, wherein a reflection factor of the object is measured by extracting the illumination light only, and wherein the emission light quantity of the reference light is adjusted in accordance with a light adjusting condition determined on the basis of the measurement of the reflection factor.

25. A method according to claim 23, wherein a plurality of pulse lights are taken in within a taking-in time of an image pickup device where the interference image is imaged, and, based on this, the illumination light and the reference light are incoherence-transformed.

26. A method according to claim 23, wherein a plurality of light attenuating filters having different transmission factors and being insertable and retractable into and out of a light path are provided between the light source and a fiber for directing the illumination light to an optical system, and wherein the light quantity of the illumination light is adjusted on the basis of a selection of one of the attenuation filters to be inserted into the light path of the illumination light.

27. A method according to claim 23, wherein a semiconductor laser for emitting pulse light is provided as the light source, and wherein the light quantity of the illumination light is adjusted by changing a frequency of the pulse light.

28. A method according to claim 23, wherein the position of the pattern is measured on the basis of an image produced with a focus with which a difference in reflection factor between surface levels of a pattern portion of the object and of a non-pattern portion of the object becomes largest.

29. A position detecting system for measuring a position of a pattern formed on an object to be observed, said portion detecting system comprising:
a light source for emitting coherent light;
means for incoherence-transforming the light from said light source;
a beam splitter for bisecting the light from said light source;
an optical system for illuminating the pattern surface of the object with illumination light corresponding to one of divided lights, and for forming an interference image upon a photoelectric converting element while combining reference light corresponding to the other light with reflection light from the pattern surface;
means for adjusting a light quantity of the reference light; and a photoelectric converting device for converting the interference image into a signal.

30. A position detecting system according to claim 29, wherein said optical system has a conjugate mirror disposed at a plane optically conjugate with the pattern surface, for reflecting the reference light.

31. A position detecting system according to claim 30, further comprising a first fiber for directing the illumination light to said optical system, and a second fiber for directing the reference light to said optical system, and wherein said adjusting means adjusts the light quantity to the illumination light before the first fiber.

32. A position detecting system for measuring a position of a pattern formed on an object to be observed, said position detecting system comprising:
   a light source for emitting a coherent light;
   a beam splitter for bisecting light from said light source into illumination light to be projected to the pattern surface of the object and reference light therefor;
   means for incoherence-transforming the illumination light and the reference light;
   an optical system for projecting the illumination light to the pattern surface and for imaging an interference image by combining a reflection light from the pattern surface and the reference light;
   means for adjusting a light quantity of the illumination light; and
   a photoelectric converting device for converting the interference image into a signal.

33. A position detecting system for measuring a position of a pattern formed on an object to be observed, said position detecting system comprising:
   at least a pair of light sources for emitting mutually coherent light beams, wherein a light quantity of at least one of them is adjustable;
   incoherence-transforming means for transforming illumination light emitted from one of the light sources into coherent light;
   an optical system for projecting the illumination light to the pattern surface of the object, and for imaging an interference image by combining reflection light from the pattern surface with the reference light; and
   a photoelectric converting element for converting the interference image into a signal.

34. An exposure apparatus for printing a pattern of an original upon a substrate, said apparatus comprising:
   exposure means; and
   a position detecting system for measuring a position of a pattern formed on an object to be observed, said position detecting system having (i) a light source for emitting coherent light, (ii) means for incoherence-transforming the light from said light source, (iii) a beam splitter for bisecting the light from said light source, (iv) an optical system for illuminating the pattern surface of the object with illumination light corresponding to one of divided lights, and for forming an interference image upon a photoelectric converting element while combining reference light corresponding to the other light with reflection light from the pattern surface, (v) means for adjusting a light quantity of the reference light, and (vi) a photoelectric converting device for converting the interference image into a signal.

35. An exposure apparatus for printing a pattern of an original onto a substrate, said apparatus comprising:
   exposure means; and
   a position detecting system for measuring a position of a pattern formed on an object to be observed, said position detecting system having (i) a light source for emitting coherent light, (ii) a beam splitter for bisecting light from said light source into illumination light to be projected to the pattern surface of the object and reference light therefor, (iii) means for incoherence-transforming the illumination light and the reference light, (iv) an optical system for projecting the illumination light to the pattern surface and for imaging an interference image by combining reflection light from the pattern surface and the reference light, (v) means for adjusting a light quantity of the illumination light, and (vi) a photoelectric converting device for converting the interference image into a signal.

36. An exposure apparatus for printing a pattern of an original upon a substrate, said apparatus comprising:
   exposure means; and
   a position detecting system for measuring a position of a pattern formed on an object to be observed, said position detecting system including (i) at least a pair of light sources for emitting mutually coherent light beams, wherein a light quantity of at least one them is adjustable, (ii) incoherence-transforming means for transforming illumination light emitted from one of the light sources into incoherent light, (iii) an optical system for projecting the illumination light to the pattern surface of the object, and for imaging an interference image by combining reflection light from the pattern surface with the reference light, and (iv) a photoelectric converting element for converting the interference image into a signal.

37. A device manufacturing method, comprising the steps of:
   providing a group of production machines for performing various processes, including an exposure apparatus for printing, by exposure, a pattern of an original on a substrate, in a semiconductor manufacturing factory, wherein the exposure apparatus has a position detecting system for measuring a position of a pattern formed on an object to be observed, and wherein the position detecting system includes (i) a light source for emitting coherent light, (ii) means for incoherence-transforming the light from the light source, (iii) a beam splitter for bisecting the light from the light source, (iv) an optical system for illuminating the pattern surface of the object with illumination light corresponding to one of divided lights, and for forming an interference image upon a photoelectric converting element while combining reference light corresponding to the other light with reflection light from the pattern surface, (v) means for adjusting a light quantity of the reference light, and (vi) a photoelectric converting device for converting the interference image into a signal; and
   producing a semiconductor device through plural processes using the production machine group.

38. A method according to claim 37, further comprising (i) connecting the production machines of the group with each other through a local area network, and (ii) executing data-communication concerning information related to at least one production machine of the production machine group, between the local area network and an external network outside the semiconductor manufacturing factory.

39. A method according to claim 38, wherein a database provided by a vendor or a user of the exposure apparatus can be accessed through the external network so that maintenance information related to the production machine can be obtained through the data communication, and wherein production control can be performed on the basis of data communication made through the external network and between the semiconductor factory and a separate semiconductor factory.

40. A semiconductor manufacturing factory, comprising:

a group of production machines for performing various processes, including an exposure apparatus for printing, by exposure, a pattern of an original on a substrate, in a semiconductor manufacturing factory, wherein the exposure apparatus has a position detecting system for measuring a position of a pattern formed on an object to be observed, and wherein the position detecting system includes (i) a light source for emitting coherent light, (ii) means for incoherence-transforming the light from said light source, (iii) a beam splitter for bisecting the light from said light source, (iv) an optical system for illuminating the pattern surface of the object with illumination light corresponding to one of divided lights, and for forming an interference image upon a photoelectric converting element while combining reference light from the pattern surface, (v) means for adjusting a light quantity of the reference light, and (vi) a photoelectric converting device for converting the interference image into a signal;

a local area network for connecting the production machines of the production machine group with each other; and a gateway for enabling an access from the local area network to an external network outside the factory, wherein information related to at least one production machine in the group can be data communicated by use of the local area network and the gateway.

41. A method of executing maintenance for an exposure apparatus, provided in a semiconductor manufacturing factory, said method comprising the steps of:

preparing, by a vendor or a user of the exposure apparatus, a maintenance database connected to an external network outside the semiconductor manufacturing factory, wherein the exposure apparatus includes (i) a light source for emitting coherent light, (ii) means for incoherence-transforming the light from the light source, (iii) a beam splitter for bisecting the light from the light source, (iv) an optical system for illuminating a pattern surface of an object to be observed, with illumination light corresponding to one of divided lights, and for forming an interference image upon a photoelectric converting element while combining reference light corresponding to the other light with reflection light from the pattern surface, (v) means for adjusting a light quantity of the reference light, and (vi) a photoelectric converting device for converting the interference image into a signal;

admitting an access from the semiconductor manufacturing factory to the maintenance database through the external network; and transmitting maintenance information stored in the maintenance database to the semiconductor manufacturing factory through the external network.

42. A device manufacturing method, comprising the steps of:

providing a group of production machines for performing various processes, including an exposure apparatus for printing, by exposure, a pattern of an original on a substrate, in a semiconductor manufacturing factory, wherein the exposure apparatus has a position detecting system for measuring a position of a pattern formed on an object to be observed, and wherein the position detecting system includes (i) a light source for emitting coherent light, (ii) a beam splitter for bisecting light from the light source into illumination light to be projected to the pattern surface of the object and reference light therefor, (iii) means for incoherence-transforming the illumination light and the reference light, (iv) an optical system for projecting the illumination light to the pattern surface and for imaging an interference image by combining reflection light from the pattern surface and the reference light, (v) means for adjusting a light quantity of the illumination light, and (vi) a photoelectric converting device for converting the interference image into a signal; and producing a semiconductor device through plural processes using the production machine group.

43. A method according to claim 42, further comprising (i) connecting the production machines of the group with each other through a local area network, and (ii) executing data-communication concerning information related to at least one production machine of the production machine group, between the local area network and an external network outside the semiconductor manufacturing factory.

44. A method according to claim 43, wherein a database provided by a vendor or a user of the exposure apparatus can be accessed through the external network so that maintenance information related to the production machine can be obtained through the data communication, and wherein production control can be performed on the basis of data communication made through the external network and between the semiconductor factory and a separate semiconductor factory.

45. A semiconductor manufacturing factory, comprising:

a group of production machines for performing various processes, including an exposure apparatus for printing, by exposure, a pattern of an original on a substrate, in a semiconductor manufacturing factory, wherein the exposure apparatus has a position detecting system for measuring a position of a pattern formed on an object to be observed, and wherein the position detecting system includes (i) a light source for emitting coherent light, (ii) a beam splitter for bisecting light from the light source into illumination light to be projected to the pattern surface of the object and reference light therefor, (iii) means for incoherence-transforming the illumination light and the reference light, (iv) an optical system for projecting the illumination light to the pattern surface and for imaging an interference image by combining reflection light from the pattern surface and the reference light, (v) means for adjusting a light quantity of the illumination light, and (vi) a photoelectric converting device for converting the interference image into a signal;

a local area network for connecting the production machines of the production machine group with each other; and a gateway for enabling an access from the local area network to an external network outside the factory, wherein information related to at least one production machine in the group can be data communicated by use of the local area network and the gateway.

46. A method of executing maintenance for an exposure apparatus, provided in a semiconductor manufacturing factory, said method comprising the steps of:

preparing, by a vendor or a user of the exposure apparatus, a maintenance database connected to an external network outside the semiconductor manufacturing factory, wherein the exposure apparatus includes (i) a light source for emitting coherent light, (ii) a beam splitter for bisecting light from the light source into illumination light to be projected to the pattern surface of the object and reference light therefor, (iii) means for incoherence-transforming the illumination light and the reference light, (iv) an optical system for projecting the illumination light to the pattern surface and for imaging an interference image by combining reflection light from the pattern surface and the reference light, (v) means for adjusting a light quantity of the illumination light, and (vi) a photoelectric converting device for converting the interference image into a signal;

admitting an access from the semiconductor manufacturing factory to the maintenance database through the external network; and transmitting maintenance information stored in the maintenance database to the semiconductor manufacturing factory through the external network.

47. A device manufacturing method, comprising the steps of:

providing a group of production machines for performing various processes, including an exposure apparatus for printing, by exposure, a pattern of an original on a substrate, in a semiconductor manufacturing factory, wherein the exposure apparatus has a position detecting system for measuring a position of a pattern formed on an object to be observed, and wherein the position detecting system includes (i) at least a pair of light source for emitting mutually coherent light beams, wherein a light quantity of at least one of them is adjustable, (ii) incoherence-transforming means for transforming illumination light emitted from one of the light sources into incoherent light, (iii) an optical system for projecting the illumination light to the pattern surface of the object, and for imaging an interference image by combining reflection light from the pattern surface with the reference light, and (iv) a photoelectric converting element for converting the interference image into a signal; and producing a semiconductor device through plural processes using the production machine group.

48. A method according to claim 47, further comprising (i) connecting the production machines of the group with each other through a local area network, and (ii) executing data-communication concerning information related to at least one production machine of the production machine group, between the local area network and an external network outside the semiconductor manufacturing factory.

49. A method according to claim 48, wherein a database provided by a vendor or a user of the exposure apparatus can be accessed through the external network so that maintenance information related to the production machine can be obtained through the data communication, and wherein production control can be performed on the basis of data communication made through the external network and between the semiconductor factory and a separate semiconductor factory.

50. A semiconductor manufacturing factory, comprising:

a group of production machines for performing various processes, including an exposure apparatus for printing, by exposure, a pattern of an original on a substrate, in a semiconductor manufacturing factory, wherein the exposure apparatus has a position detecting system for measuring a position of a pattern formed on an object to be observed, and wherein the position detecting system includes (i) at least a pair of light sources for emitting mutually coherent light beams, wherein a light quantity of at least one of them is adjustable, (ii) incoherence-transforming means for transforming illumination light emitted from one of the light sources into incoherent light, (iii) an optical system for projecting the illumination light to the pattern surface of the object, and for imaging an interference image by combining reflection light from the pattern surface with the reference light, and (iv) a photoelectric converting element for converting the interference image into a signal;

a local area network for connecting the production machines of the production machine group with each other; and a gateway for enabling an access from the local area network to an external network outside the factory, wherein information related to at least one production machine in the group can be data communicated by use of the local area network and the gateway.

51. A method of executing maintenance for an exposure apparatus, provided in a semiconductor manufacturing factory, said method comprising the steps of:

preparing, by a vendor or a user of the exposure apparatus, a maintenance database connected to an external network outside the semiconductor manufacturing factory, wherein the exposure apparatus includes (i) at least a pair of light sources for emitting mutually coherent light beams, wherein a light quantity of at least one of them is adjustable, (ii) incoherence-transforming means for transforming illumination light emitted from one of the light sources into incoherent light, (iii) an optical system for projecting the illumination light to the pattern surface of the object, and for imaging an interference image by combining reflection light from the pattern surface with the reference light, and (iv) a photoelectric converting element for converting the interference image into a signal;

admitting an access from the semiconductor manufacturing factory to the maintenance database through the external network; and transmitting maintenance information stored in the maintenance database to the semiconductor manufacturing factory through the external network.

* * * * *

UNITED STATES PATENT AND TRADEMARK OFFICE
CERTIFICATE OF CORRECTION

PATENT NO.    : 6,552,798 B2
DATED         : April 22, 2003
INVENTOR(S)   : Hideki Ina et al.

It is certified that error appears in the above-identified patent and that said Letters Patent is hereby corrected as shown below:

Column 8,
Line 1, "be" should read -- by --.
Line 29, "laser the" should read -- the laser --.

Column 10,
Line 16, "alight" should read -- a light --.

Column 11,
Line 24, "Tf=0.7*Is*Ti/Ii." should read -- Tt=0.7*Is*Ti/Ii. --.
Line 26, "Ti" should read -- Tt --.
Line 28, "Ti" should read -- Ii --.
Line 42, "filters have" should read -- filters having --.

Column 14,
Line 6, "data communicated" should read -- data-communicated --, and "IN" should read -- In --.
Line 12, "data communicated." should read -- data-communicated. --.

Column 20,
Line 24, "one" should read -- one of --.

Column 24,
Line 31, "data communicated." should read -- data-communicated. --.

Signed and Sealed this

Thirteenth Day of January, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,552,798 B2
DATED : April 22, 2003
INVENTOR(S) : Hideki Ina et al.

It is certified that error appears in the above-identified patent and that said Letters Patent is hereby corrected as shown below:

<u>Column 8,</u>
Line 15, "exactly." should read -- exactly.
    The adjustment of reference light may be done without using attenuation filters of different transmission factors. Examples are as follows. --.

Signed and Sealed this

Sixteenth Day of March, 2004

JON W. DUDAS
*Acting Director of the United States Patent and Trademark Office*